United States Patent [19]

Carmen et al.

[11] Patent Number: 5,155,614
[45] Date of Patent: Oct. 13, 1992

[54] LOW-POWER DEMODULATING RECEIVER WITH AMPLIFIER STAGES SHARING THE SAME BIAS CURRENT

[75] Inventors: Ralph H. Carmen, Lebanon, N.J.; James M. Rodgers, Harrison, Ark.

[73] Assignee: Duncan Industries Parking Control Systems Corp., Harrison, Ark.

[21] Appl. No.: 780,422

[22] Filed: Oct. 22, 1991

Related U.S. Application Data

[63] Continuation of Ser. No. 487,630, Mar. 2, 1990, abandoned.

[51] Int. Cl.$^5$ .................................... H04B 10/06
[52] U.S. Cl. ............................... 359/189; 359/154; 330/59
[58] Field of Search ............... 359/189, 181, 154, 152, 359/143; 330/59, 296, 308, 310; 375/75; 455/341

[56] References Cited

U.S. PATENT DOCUMENTS

| | | | |
|---|---|---|---|
| 3,166,732 | 1/1965 | Ljungman et al. | 340/932.2 |
| 3,535,870 | 10/1970 | Mitchell | 368/6 |
| 3,909,826 | 9/1975 | Schildmeier et al. | 340/524 |
| 3,999,372 | 12/1976 | Welch et al. | 368/6 |
| 4,034,193 | 7/1977 | Jackson | 364/465 |
| 4,119,948 | 10/1978 | Ward et al. | 340/870.02 |
| 4,213,119 | 7/1980 | Ward et al. | 455/606 |
| 4,283,772 | 8/1981 | Johnston | 364/900 |
| 4,298,839 | 11/1981 | Johnston | 324/157 |
| 4,306,219 | 12/1981 | Main et al. | 340/825.34 |
| 4,310,890 | 1/1982 | Trehn et al. | 364/467 |
| 4,454,414 | 6/1984 | Benton | 235/379 |
| 4,500,870 | 2/1985 | Krohn et al. | 341/14 |
| 4,542,469 | 9/1985 | Brandyberry et al. | 364/483 |
| 4,621,330 | 11/1986 | Weikel | 364/483 |
| 4,636,637 | 1/1987 | Van Orsdel | 250/231.11 |
| 4,641,378 | 2/1987 | McConnell et al. | 359/189 |
| 4,680,704 | 7/1987 | Konicek | 364/525 |
| 4,713,841 | 12/1987 | Porter et al. | 455/619 |
| 4,724,521 | 2/1988 | Goerne | 455/619 |
| 4,772,859 | 9/1988 | Sakai | 330/308 |
| 4,783,623 | 11/1988 | Edwards et al. | 324/156 |
| 4,792,032 | 12/1988 | Shapiro | 194/243 |
| 4,792,677 | 12/1988 | Edwards et al. | 250/231.13 |
| 4,823,928 | 4/1989 | Speas | 194/217 |
| 4,825,425 | 4/1989 | Turner | 368/7 |
| 4,868,893 | 9/1989 | Hammond | 455/617 |
| 4,935,705 | 6/1990 | Estanislao et al. | 330/296 |
| 4,972,512 | 11/1990 | Garskamp | 330/310 |
| 5,010,588 | 4/1991 | Gimlett | 359/189 |

FOREIGN PATENT DOCUMENTS 2077475 12/1981 United Kingdom .

OTHER PUBLICATIONS

D. L. Schilling and C. Belove, Electronic Circuits: Discrete and Integrated (1968), chs. 7 and 8 (pp. 220–325) Motorola, Inc., products in *IC Master Selection Gide*, pp. 3821–3822 (Hearst Business Communications, Inc., 1985).

Mars Electrcnics marketing brochure, "The Future is on Our Minds", (1986).

Schlumberger Parking and Transit division, advertisment for SmartMech DPM 3910 in "The Parking Professional" (Mar. 1989 issue) P.O.M., Inc., advertisement for the A.P.M. ® parking meter in the Parking Professional (Jun. 1988 issue).

P.O.M., Inc., brochure for an A.P.M. ® parking meter (1987).

FKI-Tully brochure for a parking meter (date unknown).

Kaspar Wire Works, Inc., product brochure for Sho--Rack TK-Electronic TM Coin Mechanism (before Mar. 2, 1990).

Bellatrix Systems, Inc., advertisement for Newspaper Tracking System TM (before Mar. 2, 1990).

*Primary Examiner*—Edward L. Coles, Sr.
*Assistant Examiner*—Kinfe-Michael Negash
*Attorney, Agent, or Firm*—James P. Ryther

[57] ABSTRACT

A low-power receiver for extracting a digital data signal from a modulated carrier signal is disclosed. The receiver employs an amplifier whose stages share the same bias current in order to reduce power consumption.

15 Claims, 10 Drawing Sheets

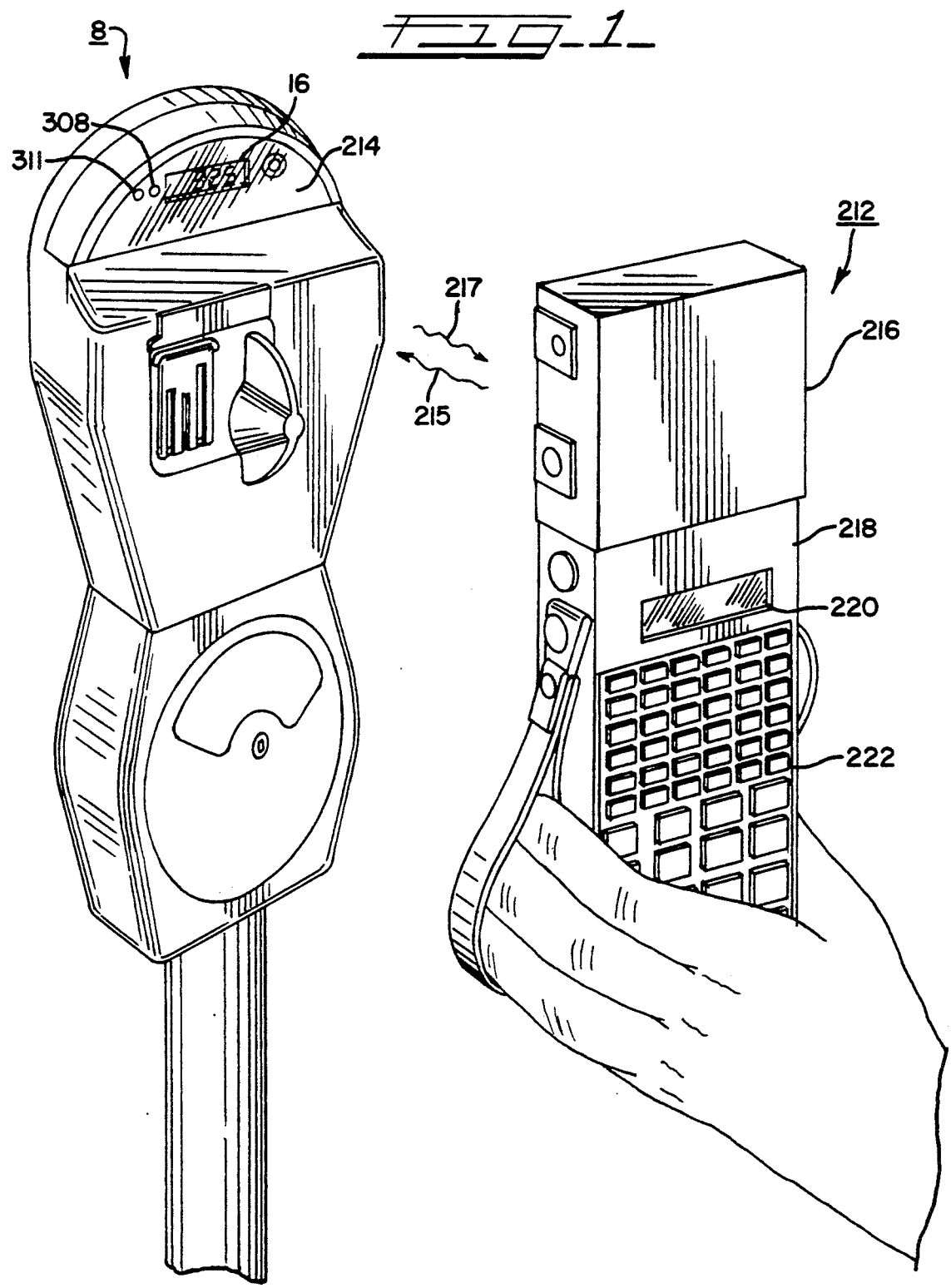

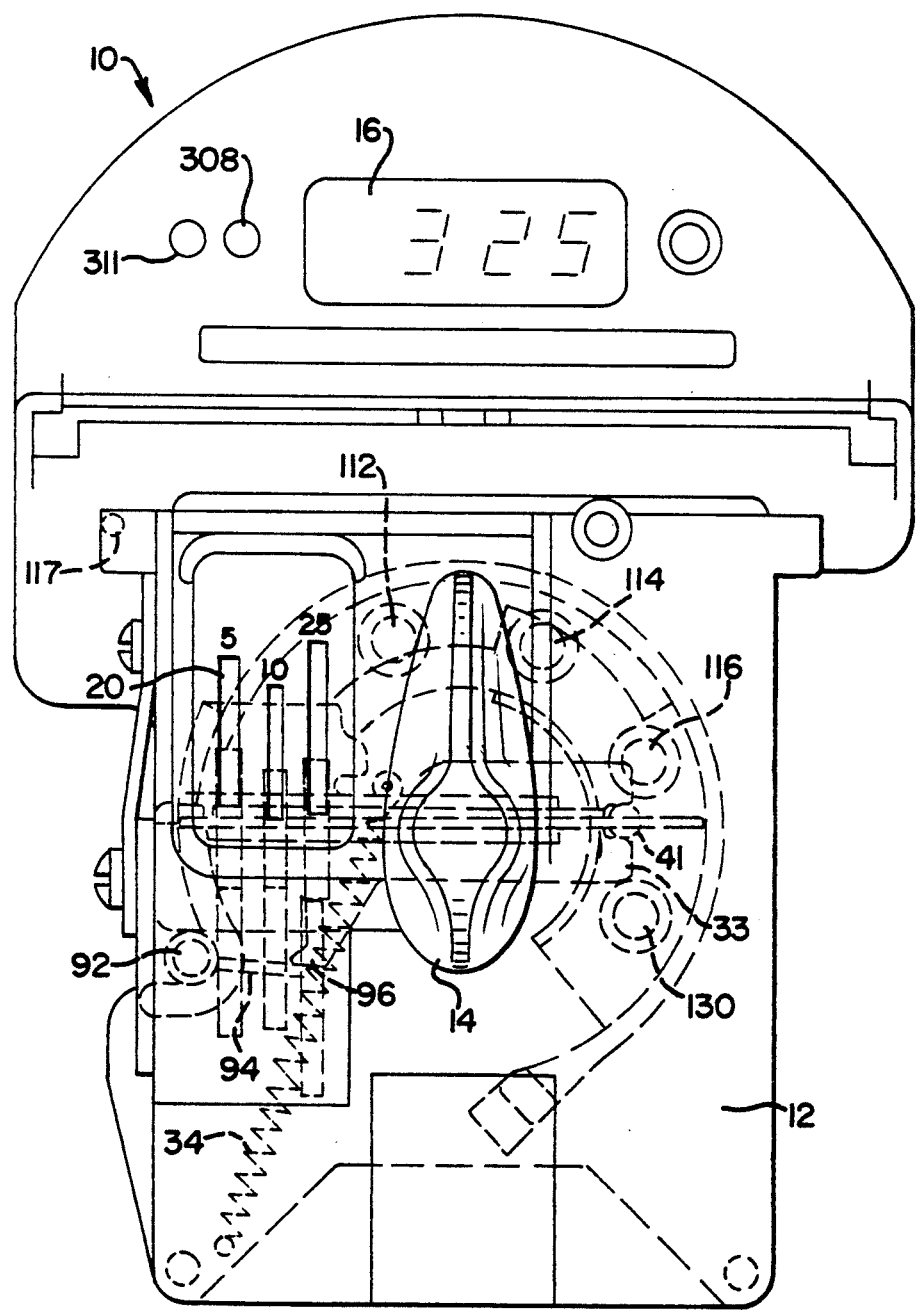

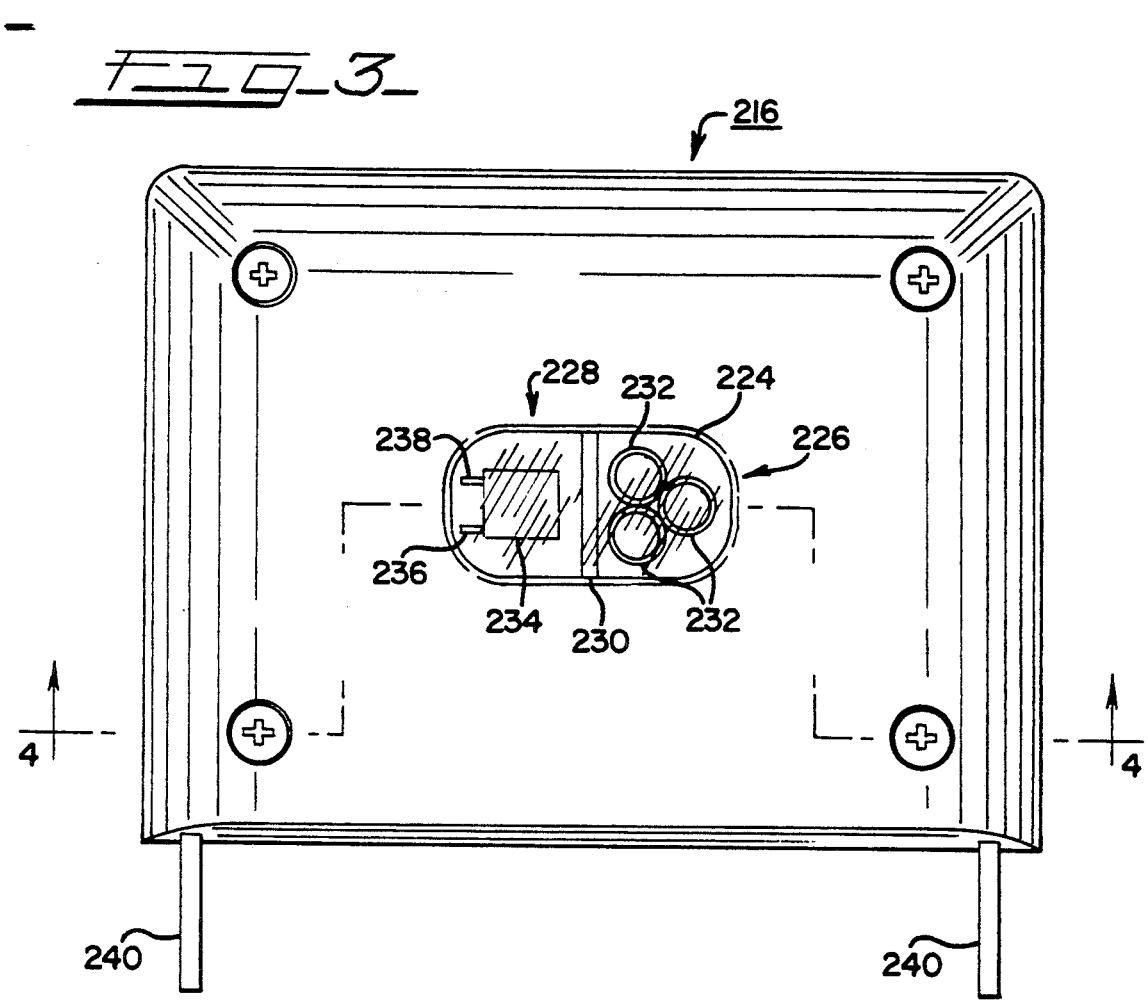
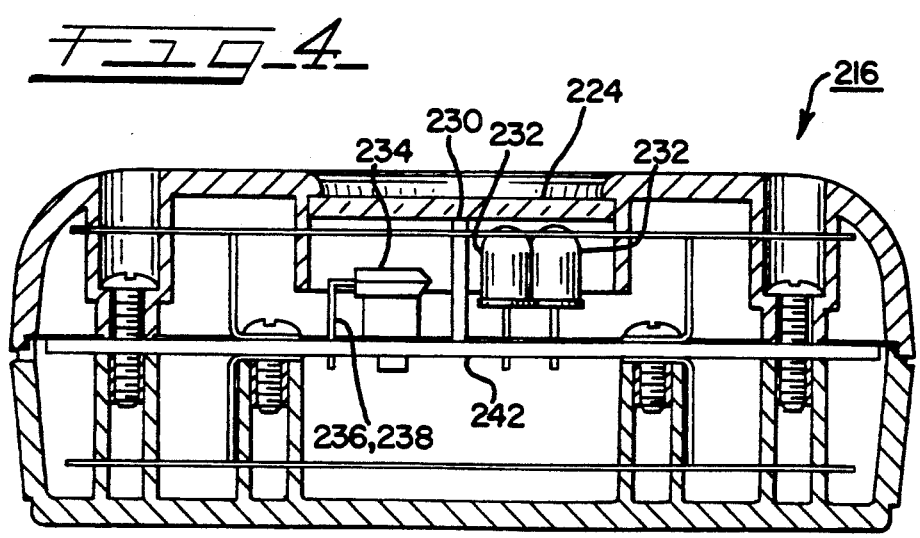

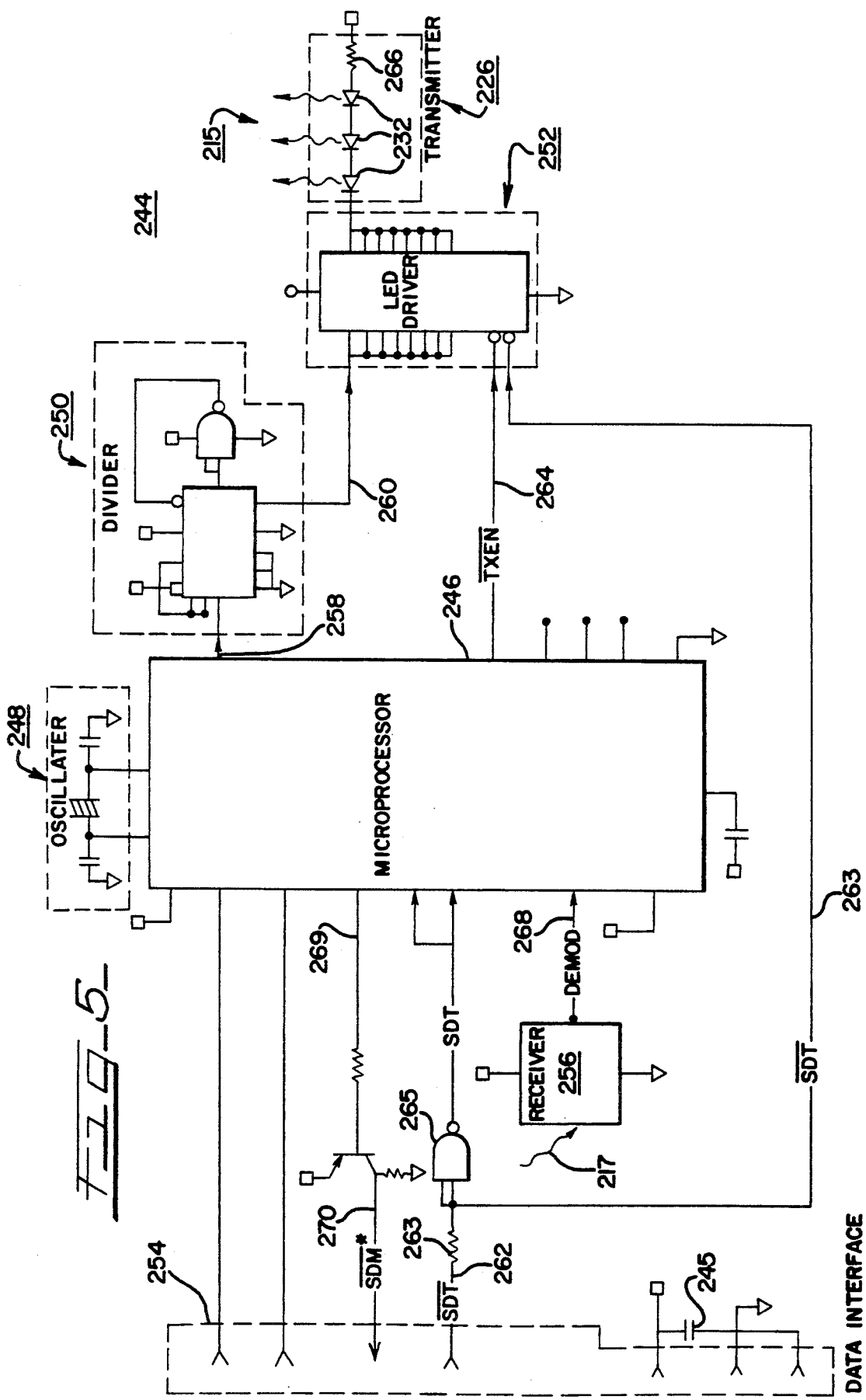

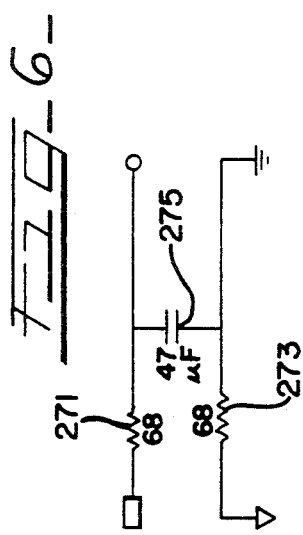
FIG-6-
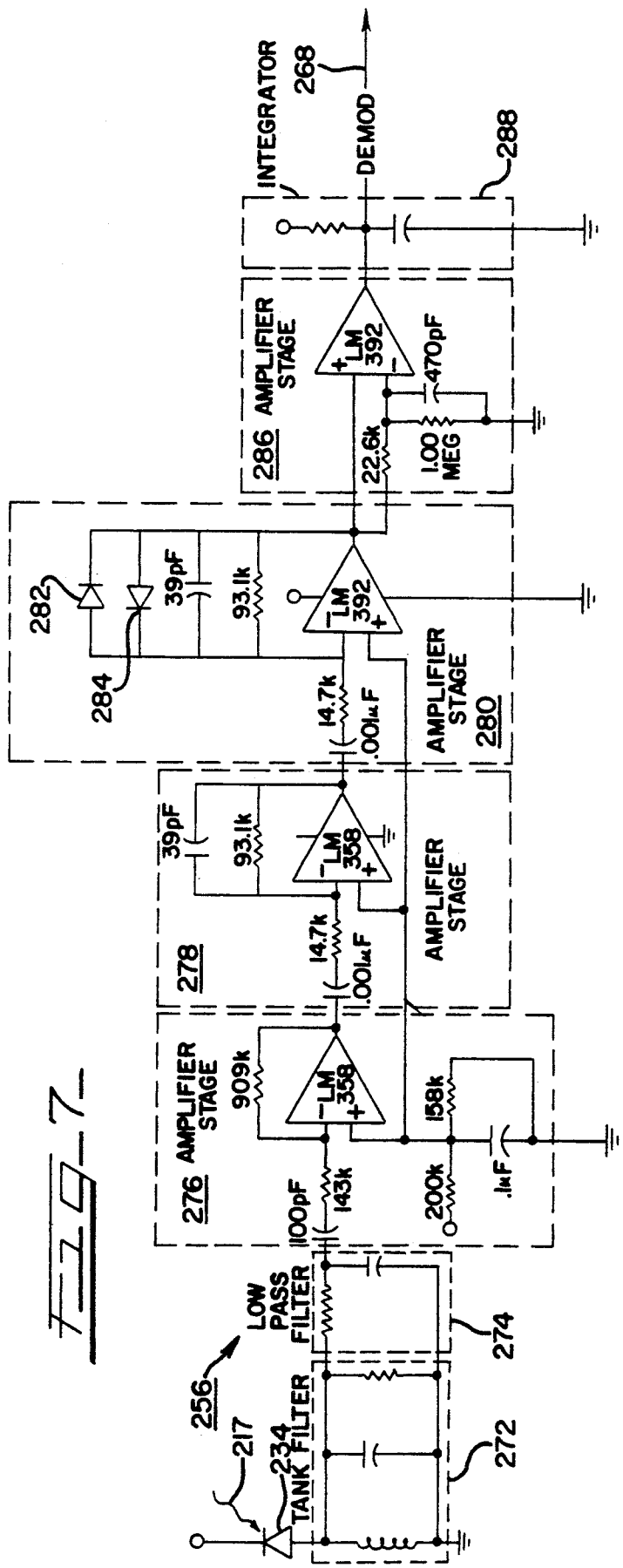
FIG-7-

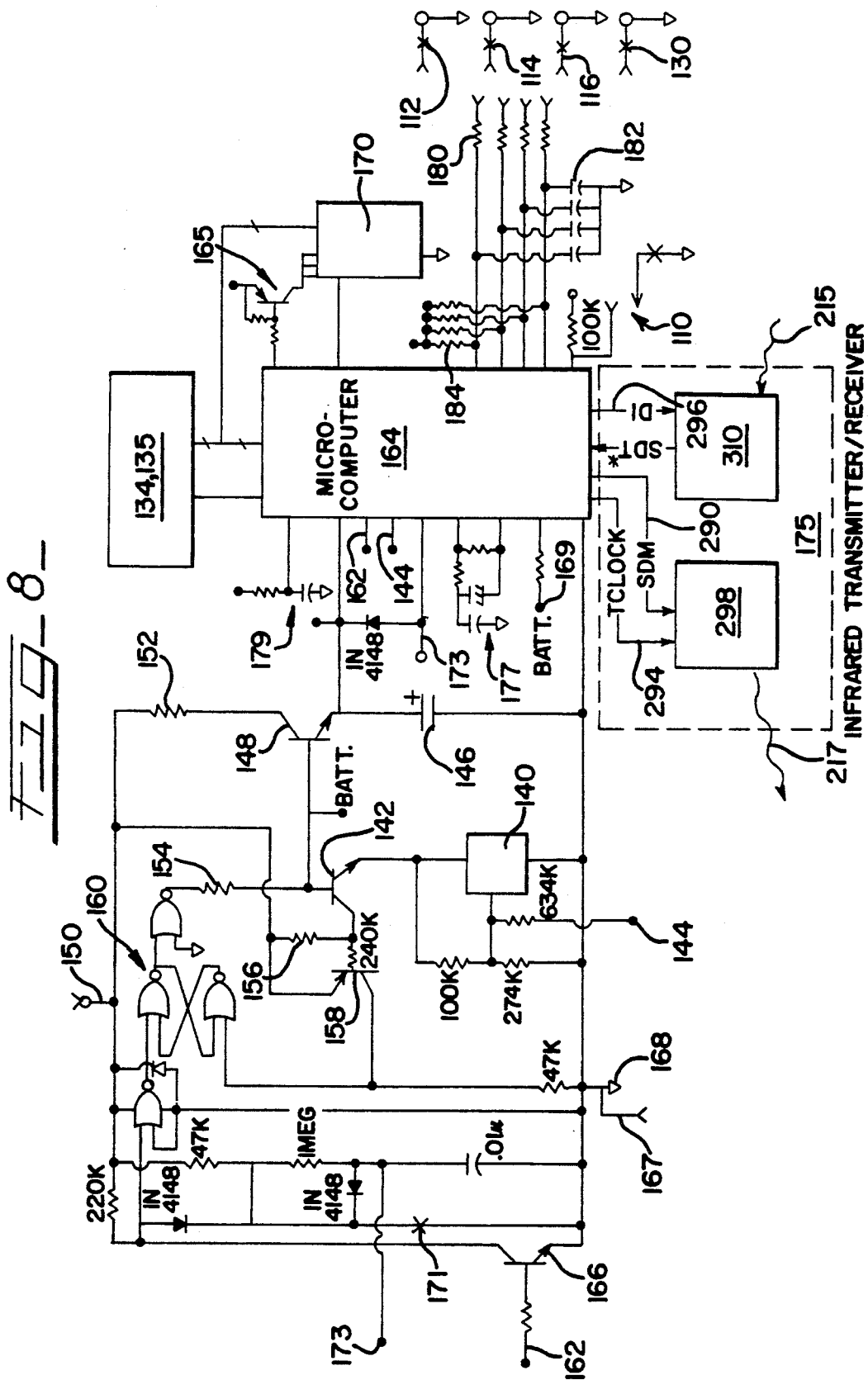

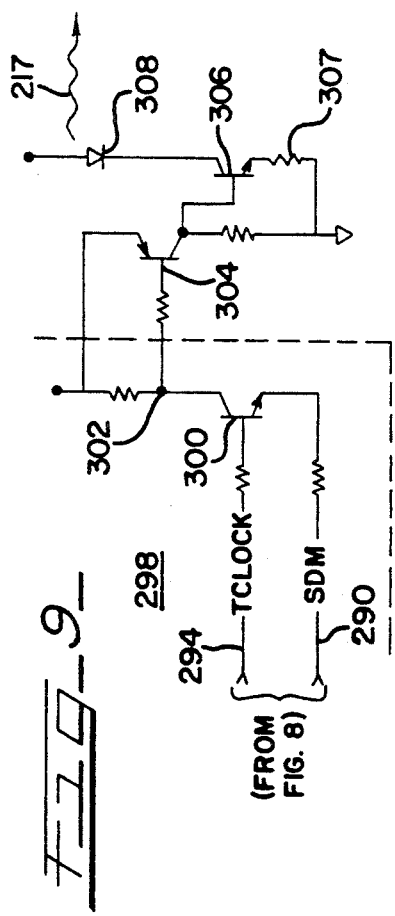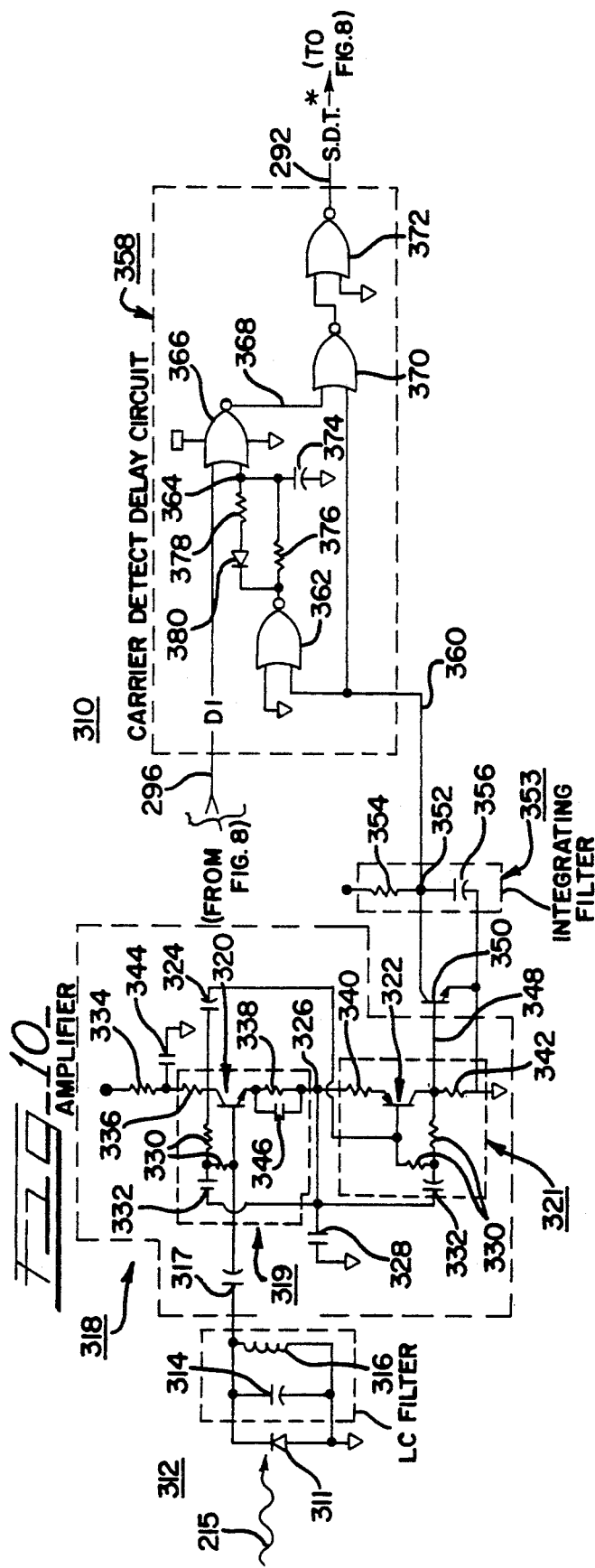

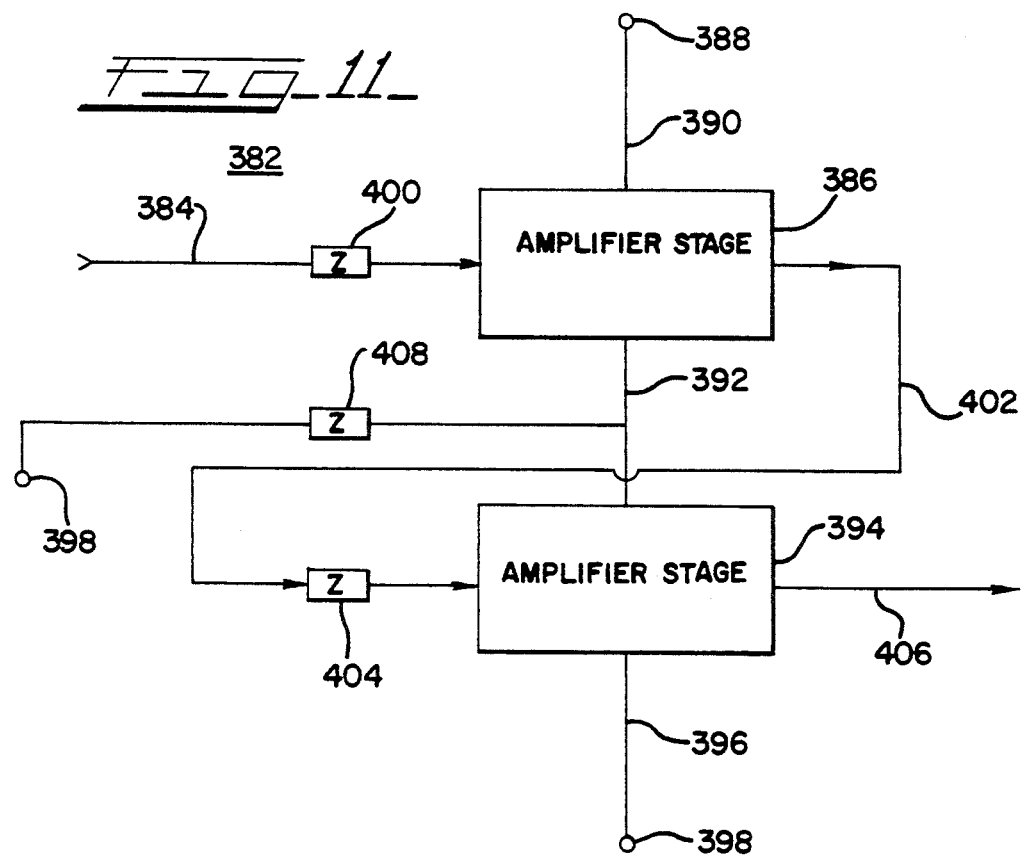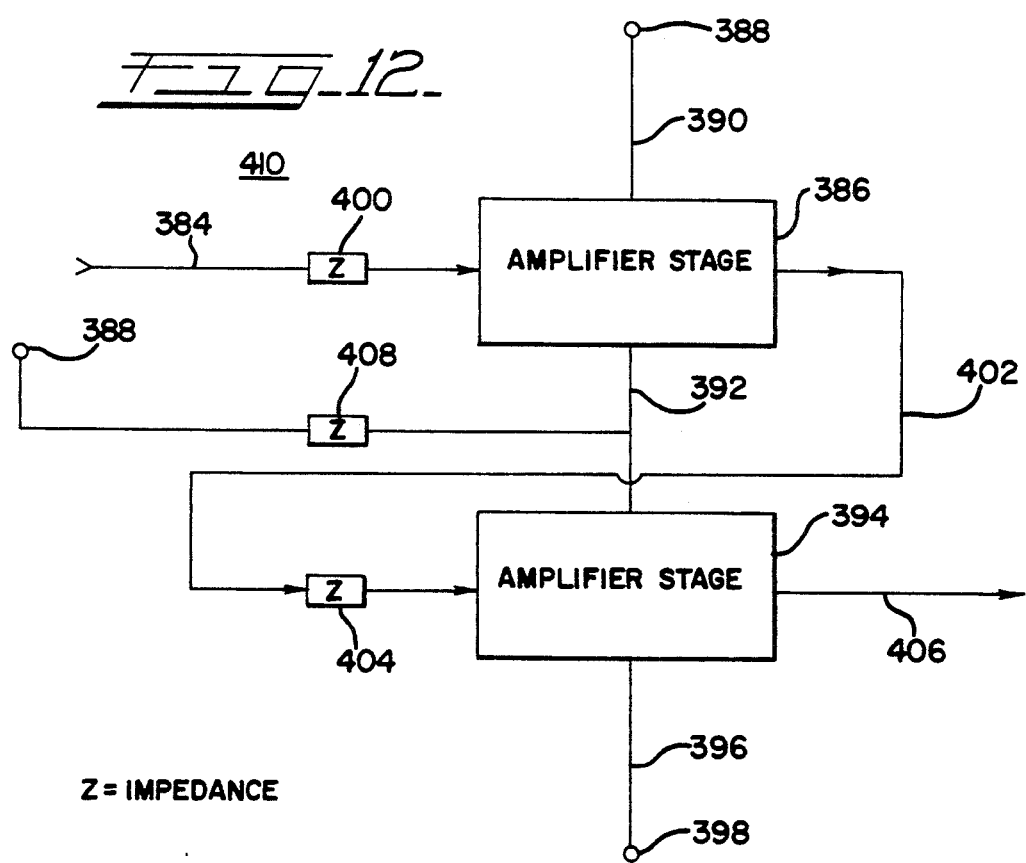

Z = IMPEDANCE

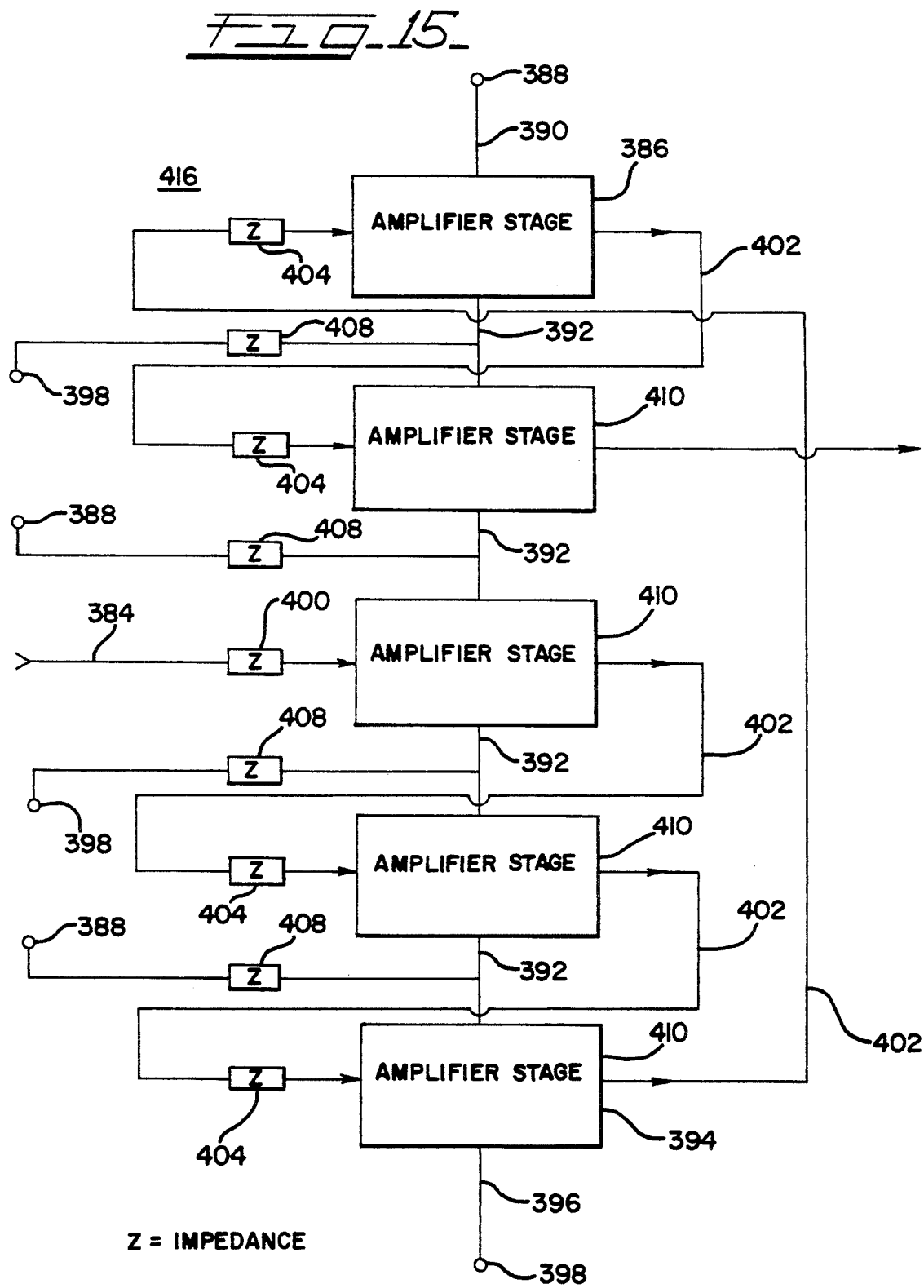

LOW-POWER DEMODULATING RECEIVER WITH AMPLIFIER STAGES SHARING THE SAME BIAS CURRENT

This is a continuation of copending application Ser. No. 07/487,630, filed on Mar. 2, 1990, now abandoned.

This disclosure (the "instant disclosure") uses certain components described more fully in the United States Patent Application of John W. Van Horn and Ralph H. Carmen for a COIN OPERATED TIMING MECHANISM, filed Jul. 24, 1989, U.S. application Ser. No. 07/384,781 (the "'781 application"), the disclosure of which is hereby incorporated herein by reference in its entirety. The '781 application has been assigned to Duncan Industries Parking Control Systems Corp., a Delaware corporation ("Duncan"); the instant application will be also assigned to Duncan.

To avoid confusion between reference numbers of the instant disclosure and reference numbers of the '781 application, the instant disclosure uses the same reference numbers as used in the '781 application for items which are the same as items in the '781 application. Reference numbers begin above 200 for items in the instant disclosure which are not the same as items in the '781 application.

BACKGROUND OF THE INVENTION

A tremendous variety of token-actuated devices are known and have proved commercially successful, including (but not limited to) parking meters which control individual parking spaces, vending machines, newspaper racks, electronic games, and jukeboxes. Many token-actuated devices respond to the insertion of a token which is legal tender (that is, a coin). Other token-actuated devices respond to a token which is not itself legal tender and which is ordinarily specifically designed for use in a particular type of token-actuated device. (As used herein the term "token" includes both a token which is legal tender in some nation and a specially-designed token which is not legal tender.)

Many early token-actuated devices were wholly mechanical. Examples of such devices are early parking meters, such as those disclosed in U.S. Pat. No. 1,799,056 to Miller and U.S. Pat. No. 2,603,288 to Sollenberger.

Although mechanical token-actuated devices remain useful, mechanical devices have disadvantages in comparison with electronic devices. Mechanical devices generally have many more moving parts than electronic devices; those moving parts tend to need repair or replacement more frequently than electronic parts. Replacing mechanical parts ordinarily requires much more labor than replacing electronic parts.

Electronic devices have other advantages in comparison with mechanical devices. For example, electronic devices can economically provide a wide variety of special functions which would be prohibitively expensive to implement in a wholly mechanical device.

Thus, those working in the field of token-actuated devices have sought to develop token-actuated devices which incorporate electronic components. See, for example, U.S. Pat. Noa. 3,757,916 to Selby; 4,031,991 to Malott; 4,792,032 to Shapiro; 4,848,556 to Shah, Pester, and Stern; and 4,823,928 to Speas.

One problem which has impeded the wider use of electronic token-actuated devices is the amount of current which an electronic token-actuated device draws in its operation. Many types of token-actuated devices —particularly parking meters and newspaper racks—are ordinarily used in places where the devices cannot be conveniently connected to electric power lines. Thus, those types of token-actuated devices must usually rely on batteries for electric power. (U.S. Pat. No. 4,823,928 to Speas also discloses the use of solar cells.) Because a battery can only supply a limited amount of current before the battery must be recharged and/or replaced, a battery-powered token-actuated device should draw as little current as possible.

The requirement for low current consumption has limited the ability of battery-powered token-actuated devices—such as parking meters—to perform certain desirable functions. Thus, there has been and is a need to develop improved designs so that electronic token-actuated devices can perform desired functions with low current consumption.

One function which electronic token-actuated devices can perform, and which mechanical token-actuated devices can perform (if at all) only at great cost and inconvenience, is to provide a signal which indicates the number of tokens and (if the tokens are legal tender) the amount of money contained in a token vault or other receptacle attached to the token-actuated device. Such signals assist a central authority (such as the parking division of a city) in checking to make sure that all money received by token-actuated devices has actually been returned to the central authority by the personnel assigned to collect the money from the token-actuated devices. In addition, an electronic token-actuated device (such as an electronic parking meter) can store and later transfer other types of detailed information about usage of the token-actuated device. Such other information may include, in the case of a parking meter, the time of day at which the parking meter was used and the length of time for which the parking meter was used at the time when it was used. Such information can be very useful to the parking and traffic authorities of a city in determining what fare structure to implement for a series of parking meters and in learning when peak usage periods occur.

As the application of electronic technology to token-actuated devices has become more advanced, token-actuated devices have been designed including advanced electronic components such as programmable microprocessors and potentially considerable amounts of memory to hold a stored program to control the microprocessor and also to hold data which may later be collected from the microprocessor. The conventional way of changing the program for the microprocessor has been to replace one read-only memory chip containing one program with another read-only memory chip containing another program. Alternatively, some token-actuated devices (such as the parking meter sold under the registered trademark "EPM" by Duncan Industries Parking Control Systems Corp.) have incorporated a data interface connected to a wire connector. The token-actuated device sends data to, or receives data from, such a data interface when someone (such as a parking meter attendant assigned to collect money from parking meters) attaches a cable to the wire connector and, using a hand-held device, receives data from, or sends data to, the electronic components inside the parking meter.

Such a wire connector has several disadvantages. First, it presents an additional opening through which the elements may potentially enter the interior of a token-actuated device. This disadvantage is particularly severe for token-actuated devices (such as parking meters) located outdoors, Second, wire connectors offer some possibility for vandals to seek to tamper with a token-actuated device (such as by attaching a battery and attempting to confuse, or to interfere with the operation of, the device). Third, a wire connector requires that an attendant go through the step of connecting a wire to the wire connector. Such a step can be inefficient. For example, if there are no tokens to be removed from the token-actuated device (or if the value of the tokens in the token-actuated device is too low to make a collection stop worthwhile), it can be inefficient for an attendant to go over to the token-actuated device, connect a wire to the wire connector, and then learn that there are no tokens to collect (or not enough tokens to collect to make the stop worthwhile).

Those designing token-actuated devices have thus turned to infrared communications to dispense with the wire connectors. Infrared communications can occur through a transparent cover, which most token-actuated devices (especially parking meters) already have; this eliminates the need for an opening for a wire connector. Vandals are somewhat less likely to carry infrared communications devices than to carry tools or batteries which could be used to try to interfere with the operation of an electronic device through a wire connector. An attendant can operate an infrared communications device faster than a device which requires attachment to a wire connector on a token-actuated device. Moreover, considerable disclosure exists describing the use of infrared communications in outdoor environments—particularly as applied to utility meters.

A major difference between many token-actuated devices and utility meters is that many token-actuated devices are located away from conventional electric power lines and thus must draw their electric power from batteries (or in some instances from solar cells, such as disclosed in U.S. Pat. No. 4,823,928 to Speas). The need to rely on batteries creates a need for an infrared communications circuit to draw as little current as possible when installed in such a token-actuated device.

Conventional infrared communications circuits have the disadvantage of drawing more current than is convenient for use in a battery-powered token-actuated device. Drawing too much current reduces the lifetime of the batteries used in such a token-actuated device and thus requires more frequent replacement of the batteries. Those problems in turn reduce the efficiency of using an electronic token-actuated device and create problems of inaccurate operation of the token-actuated device when the battery runs down.

In addition, an infrared communications circuit in a token-actuated device should be able not only to send but also to receive data. It may be desirable to send data to an electronic token-actuated device to change the operating program of the device. For example, in the illustrative case of a parking meter, it may be desirable to change the amount of time allotted for a given coin or coins or to program the parking meter to switch to a maximum revenue production mode where time is erased if additional purchase is attempted after a given time interval.

Because such communication to an electronic token-actuated device can occur at any time, an infrared communications receiver in an electronic token-actuated device must be continuously able to receive communications from an authorized source. This need for continuous readiness to receive communications makes conventional infrared communications circuits even more unsuitable; such conventional infrared communications circuits draw too much current to begin with, and yet they must be ready to receive infrared communications at any time.

Moreover, environments where token-actuated devices are located may contain a wide variety of infrared light sources within the frequencies to which the infrared detector in the infrared communications circuit may respond. It is important generally that such infrared light sources not be incorrectly perceived as new data by the token-actuated device. Moreover, even if such infrared light sources are not incorrectly perceived as data, it is also important that such infrared light sources not cause the parking meter to draw current wastefully.

Finally, an infrared communications circuit in a token-actuated device must robustly resist signals from such widely-available infrared communications devices as hand-held infrared communications devices designed for use with television channel changing circuits or for use with other home entertainment devices such as compact disk players.

Thus, there has been and is a need for an improved infrared communications circuit for use in an electronic token-actuated device which remains continuously ready for receiving and sending data and has one or both of the characteristics of drawing very little power even in the presence of environmental sources of infrared light (particularly in an outdoor environment) and resisting influence from infrared communications devices intended for use with other machines.

SUMMARY OF THE INVENTION

The invention meets the foregoing technical objectives by reducing the current demands of the transmitting and receiving circuits contained in the battery-powered token-actuated device (such as the parking meter). To assure that a unit which is communicating with the device can accurately receive data from the device and send data which the device will receive correctly, the unit with which the device exchanges data should incorporate robust reception and transmission circuits which compensate for the reduced power drawn by the low-power transmitting and receiving circuits in the device.

The invention reduces the current demand of the receiving circuit by providing an improved, ultra-low power amplifier for amplifying received signals characterized by an operating frequency range. The operating frequency range may be (as one example) be defined by a carrier signal at a first frequency which is modulated by a data signal having a rate not in excess of a second frequency less than the first frequency.

In its broadest form the improved amplifier has N amplifier stages stacked in a totem-pole configuration between a higher potential and a lower potential. Each of the stages is self-biasable to operate in Class A mode, and each of the stages shares the same DC bias current. From the point at which the bias current output of each stage leads to the bias current input of another stage an impedance (which is preferably a capacitor but which may be any impedance (whether active or inactive) which performs the same function as a capacitor) connects to either the higher potential or the lower potential. Each impedance blocks DC signals but presents a very low impedance for AC signals of interest, which include at least signals over the operating frequency range. Each impedance thus isolates the bias current connection between each stage and another stage from either the higher potential or the lower potential for DC and very low frequencies but connects such bias current connection to either the higher potential or the lower potential for at least the operating frequency range.

One of the stacked amplifier stages—a first or input stage—receives an input signal. From the signal output of the first stage an amplified signal leads through a transfer line to the signal input of another stage. From the signal output of a second or output stage the output of the stacked amplifier stage leads to other components of interest. The signal output of each of the N stages (other than the second stage) leads through a signal transfer line to a signal input of another of the N stages (other than the first stage); the signal inputs and outputs between these stages may be connected in any order. The transfer lines may be characterized by an impedance (which may be a capacitor) which blocks DC signals but which is low for frequencies in the operating range.

A low-power receiving circuit for a token-actuated device with limited access to power (such as a battery-powered parking meter) has a photodiode operated in the photovoltaic mode. The photodiode is connected to a filter tuned to pass, and to present a high impedance to, signals at the frequency of carrier pulses from an external unit (such as a hand-held transceiver) which transmits data by modulating the carrier pulses by the data. The filter short-circuits the photodiode at frequencies substantially lower or higher than the frequency of the carrier. The output of the filter leads to two self-biased amplifier stages, each operable in the Class A mode, which are stacked between a higher potential and a lower potential and which share a single, low, DC bias current. The bias current output of the first stage is connected to the bias current input of the second stage and also (through an impedance such as a capacitor) to either the higher potential or the lower potential. This capacitor decouples the bias current connection between the first stage and the second stage in an AC sense for frequencies of interest and also decouples that bias current connection from the higher potential or the lower potential for DC purposes. The signal output of the first amplifier stage leads to the signal input of the second amplifier stage through an impedance (which may be a capacitor) which blocks DC signals and which is low for frequencies in the operating range. The output of the second of the two amplifier stages leads to a third amplifier stage which is biased to draw no output current unless a signal of sufficient magnitude is present at the output of the second stage Class A amplifier. The output of the third amplifier leads to a filter which substantially removes components corresponding to the carrier signal, leaving an amplified data signal which feeds to a microprocessor within the device.

To further reduce the possibility that the device may respond to false data, the output of the filter after the third amplifier leads to a carrier detect delay circuit, which in turn delays passing to the microprocessor any signal at the output of the filter after the third amplifier unless the output of that filter has remained active for a first predetermined interval of time. The carrier detect delay circuit may include a trip circuit which prevents any signal at the output of the filter from reaching the microprocessor if the output of the filter changes logic level within a second predetermined interval of time after that signal has previously changed logic level. The second predetermined interval of time is usually substantially less than the first predetermined interval of time. The microprocessor disables the carrier detect delay circuit after carrier detect is achieved. The carrier detect delay circuit may alternatively be implemented in software in the microprocessor.

BRIEF DESCRIPTION OF THE DRAWINGS

FIG. 1 shows a hand-held transceiver unit in a position for exchanging infrared communications signals with a parking meter.

FIG. 2 shows the location on a mechanism internal to the parking meter shown in FIG. 1 of an element for receiving infrared light signals and of an element for sending infrared light signals.

FIG. 3 is a view of the side of the infrared communications section of the hand-held transceiver unit which faces the parking meter in the view shown in FIG. 1.

FIG. 4 is a cross-sectional view, taken along the line 4—4 shown in FIG. 3, of the infrared communications section shown in FIG. 3.

FIG. 5 is a schematic diagram of electronic circuit components in the transmitting system of the infrared communications section shown in FIG. 1, 3, and 4.

FIG. 6 is a schematic diagram of a circuit which connects the power supply of the control section of the hand-held transceiver shown in FIG. 1 to the local positive potential and local ground of the infrared receiving system in the infrared communications section shown in FIGS. 1, 3, and 4.

FIG. 7 is a schematic diagram of the infrared receiving system of the infrared communications system shown in FIGS. 1, 3, and 4.

FIG. 8 is a schematic diagram of electronic components contained in the parking meter shown in FIG. 1.

FIG. 9 is a schematic diagram of the infrared transmitting system contained in the parking meter shown in FIG. 1.

FIG. 10 is a schematic diagram of the infrared receiving system contained in the parking meter shown in FIG. 1.

FIG. 11 is a schematic diagram of a more general version of the amplifier schematically shown in FIG. 10.

FIG. 12 is a schematic diagram of another more generalized version of the amplifier schematically shown in FIG. 10.

FIG. 15 is a schematic diagram of another more generalized version of the amplifier schematically shown in FIG. 10.

DETAILED DESCRIPTION OF THE INVENTION

Figure 13:
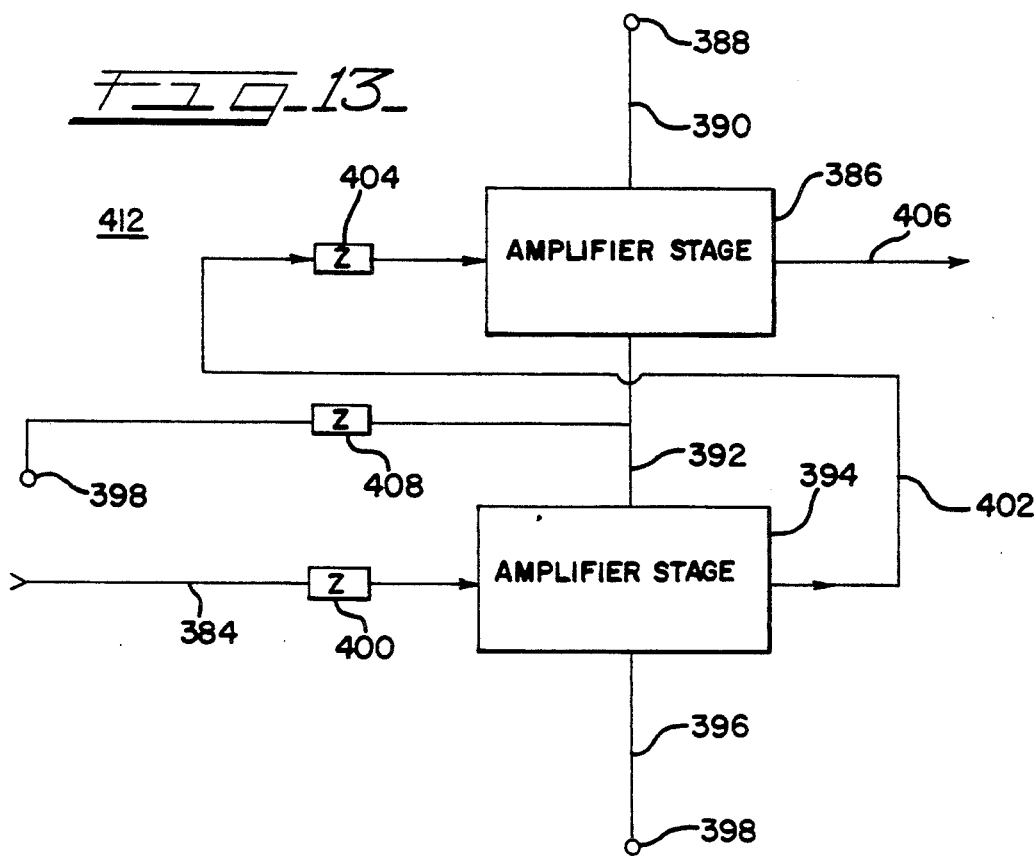
FIG. 13 is a schematic diagram of another more generalized version of the amplifier schematically shown in FIG. 10.

The Parking Meter And The Hand-Held Transceiver

FIG. 1 shows a parking meter 8 equipped with an embodiment of the invention and a hand-held transceiver 212 in a relationship which permits the parking meter 8 to receive an infrared signal 215 from the hand-held transceiver 212 and which also permits the hand-held transceiver 212 to receive an infrared signal 217 from the parking meter 8.

The parking meter 8 has a transparent window 214 (which is typically made of glass or plastic) through which a user may read a time display 16 and various warning flags such as described in the '781 patent application. (In the '781 patent application see particularly FIG. 1 and p. 6, line 22 through line 27.) The transparent window 214 is transparent to infrared light and thus permits a photodiode 311 within the parking meter 8 to receive infrared signals 215, and a light-emitting diode 308, also within the parking meter 8, to send infrared signals 217.

The hand-held transceiver 212 has a communications section 216 and a control section 218. The communications section 216 contains electronic components which send the infrared signal 215 to, and receive the infrared signal 217 from, the parking meter 8. The control section 218 contains electronic components which (1) convey to the communications section 216 data to be sent to the parking meter 8 in the signal 215 and (2) receive from the communications section 216 data sent by the parking meter 8 in the signal 217. The control section 218 has a display 220 (such as a liquid-crystal display) on which the control section 218 can display information to be read by an operator and a keypad 222 on which an operator can enter commands directing the operation of the control section 218.

The control section 218 is commercially available in standard configurations from numerous manufacturers within the United States and is alternatively available in custom configurations. The control section 218 ordinarily includes the following items (not shown): (1) a memory for storing data or commands to be sent to a parking meter 8 and for storing data received from a parking meter 8; (2) a communications interface for receiving data or commands from a host computer and for transferring data to the host computer (the host computer with its own appropriate communications interface is usually located in an office remote from the parking meter 8); and (3) a programmable microprocessor for controlling the transfer of signals to and from the control section 218 and for controlling the internal operation of the control section 218. Because the control section 218 is commercially available, and because appropriate software to manage the control section 218 is either commercially available or can readily be written by those of ordinary skill in the art, it is unnecessary to describe the control section 218 herein.

FIG. 2 is a front view of the mechanism 10 contained inside the parking meter 8. FIG. 2 shows the location of the photodiode 311 and the light-emitting diode 308 on the mechanism 10 where infrared light can pass through the transparent window 214 to the photodiode 311 and from the light-emitting diode 308.

FIG. 3 is a view of the side of the communications section 216 which faces the parking meter 8 in the view shown in FIG. 1. As shown in FIG. 3 the communications section 216 has a transparent window 224 which shields an infrared transmitter element 226 and an infrared receiver element 228, which are separated by a baffle 230. The baffle 230 is opaque to light of the wavelength emitted by the transmitter element 226 or received by the receiver element 228. The transmitter element 226 comprises three infrared-light-emitting diodes 232, each located adjacent to the other two diodes 232, all three of which are connected in series and driven over power lines (not shown in FIG. 3) by other electronic components (also not shown in FIG. 3). The receiver element 228 comprises an infrared-light-sensitive diode 234, which is connected by lines 236 and 238 to other electronic components (not shown in FIG. 3).

The communications section 216 attaches to the control section 218 by pins 240, which fit into recesses (not shown) in the control section 218. Pin connectors, not shown in either FIG. 3 or FIG. 4, provide parallel connections for electric signals between the communications section 216 and the control section 218. (The pin connectors also provide a source of positive potential and a ground for the communications section 216 connected to a source of power, such as a battery, in the control section 218.)

FIG. 4 is a cross-sectional view, taken along the line 4—4 shown in FIG. 3, of the communications section 216. As shown in FIG. 4, the light-emitting diodes 232 and the infrared-light-sensitive diode 234 are mounted on a circuit board 242, on which may be mounted the other electronic components shown schematically in FIGS. 5, 6, and 7.

The transmitter element 226 has the three light-emitting diodes 232 in the configuration shown to assure that the transmitter element 226 transmits to the parking meter 8 an infrared signal 215 of sufficient intensity that the parking meter 8 will readily correctly recognize the infrared signal 215. Such accurate reception eliminates any need to incorporate error-correction circuitry in the parking meter 8. If the parking meter 8 were not to recognize correctly the signal being transmitted by the transmitter element 226, power within the parking meter 8 would be wasted in correcting the incorrectly-received information, or, if erroneously transmitted information were not corrected, the parking meter 8 might not function correctly. Using three light-emitting diodes 232 instead of one, and connecting the three diodes 232 in series, guards against the possibility of erroneous data reception by providing greater signal strength. Since the batteries in the hand-held transceiver 212 can much more readily be replaced and/or recharged than the batteries in many individual parking meters 8, it is more efficient to place greater current demands on the hand-held transceiver 212 and thus on its battery than to risk placing unnecessary current demands on the battery in the parking meters 8.

The Transmitting And Receiving Circuits In The Communications Section 216 Of The Hand-Held Transceiver 212

Infrared communications circuits in the parking meter 8 are part of a system: they must send the signal 217 to, and receive the signal 215 from, another unit such as the hand-held transceiver 212. The design of the hand-held transceiver 212 can greatly reduce the current needs of the entirely separate electronic circuits located in the parking meter 8. This section describes the electronic circuits in the hand-held transceiver 212 which contribute to making possible the ultra-low current electronic circuits in the parking meter 8, which are described in the next section.

The circuitry illustrated in FIGS. 5, 6, 7, 8, 9, and 10 permits low power consumption by the infrared transceiver circuit in the parking meter 8 or in another token-actuated device or like machine employing the features of the invention. In those drawings and in the following description component values and identification are provided for illustrative purposes only. It will be apparent that alternative components and, component values are available which will achieve the function contemplated by the invention.

FIG. 5 is a schematic diagram of the control circuit 244 used to drive the light-emitting diodes 232 and to receive signals from the light-sensitive diode 234. Typically the components shown in FIG. 5 are located on the circuit board 242 and thus are part of the communications section 216 of the hand-held transceiver 212. Of course, they could also be incorporated in a custom-made control section 218. The components shown in FIG. 5 connect with the control section 218 at a data interface 254, which may (for example) be a pin connector and which may connect with a matching interface in the control section 218.

As shown in FIG. 5, the control circuit 244 has a capacitor 245 connected between its local positive potential and its local ground at the point where those potentials connect with power lines from the control section 218. The capacitor 245 is chosen to be sufficiently large (such as 100 uF) to provide adequate reserve for transient current demands of the circuitry connected across the local positive potential and the local ground of the control circuit 244. Such circuitry includes the circuitry shown in FIG. 5 and the parts of that circuitry shown in greater detail in FIGS. 6 and 7.

As shown in FIG. 5 the control circuit 244 comprises a microprocessor 246, an oscillator circuit 248 external to the microprocessor 246, a divider circuit 250, an LED driver 252, and a receiver and preamplifier 256 for receiving and amplifying the infrared signal 217 from the parking meter 8. The receiver and preamplifier 256 is shown schematically in FIG. 7 and described below in connection with that Figure.

The control circuit 244 exchanges signals with, and receives power connections from, the control section 218 through the data interface 254. The signals exchanged are: (1) SDM*-(complement of serial data in from the parking meter 8 as received and transferred by the communications section 216, that is, the complement of the serial data in the signal 217 from the parking meter 8 to the hand-held transceiver 212), and (2) SDT- (complement of serial data out from the hand-held transceiver 212, that is, the complement of the serial data in the signal 215 from the hand-held transceiver 212 to the parking meter 8). If transmission from the parking meter 8 and reception and signal processing by the communications section 216 are correct, SDM* will be the data SDM which the parking meter 8 is transmitting.

The oscillator circuit 248 has a crystal oscillating at an appropriate frequency chosen so that, after it is divided as described below, it will provide a basic carrier pulse frequency at which the LEDs 232 will be driven when the transmitter element 226 is activated. The microprocessor 246 internally divides the frequency of the signal of the oscillator circuit 248 to produce a signal at a suitable lower frequency on line 258, which feeds that signal to the divider circuit 250.

The divider circuit 250 in turn further divides frequency of the signal on line 258 to produce at its output line 260 a signal with the chosen carrier frequency for the signal 215, that is, for the signal SDT to modulate; the signal on line 260 feeds to the LED driver 252. The LED driver 252 may be an HC541; it uses the signal on line 260 to determine the frequency at which the LED driver 252 permits current to flow through the LEDs 232 so that the LEDs 232 flash at that frequency.

The signal SDT-, which leads over the external data interface 254, is the complement of the signal which the hand-held transceiver 212 is to transmit to the parking meter 8. The control section 218 supplies the signal SDT- over the data interface 254 to line 262. After passing a resistor 263 (which may be 33 kOhm), the signal SDT- feeds through NAND gate 265 (which inverts the signal SDT- to produce the signal SDT) to the microprocessor 246 and on line 263 to the LED driver 252. The microprocessor 246 determines through a software program and based on commands from the keyboard 222 when to transmit data to the parking meter 8; when data is to be transmitted, the microprocessor 264 asserts the signal TXEN- (complement of transmission enable) over line 264 to the LED driver 252. When TXEN- is asserted, the LED driver 252 supplies pulses of power to the LEDs 232 at the frequency of the signal on line 260 modulated by the signal SDT derived from line 263. The LED driver 252 thus transmits the signal SDT serially by modulating flashes of infrared light from the infrared LEDs 232. For example, when SDT is high, the LEDs 232 do not flash at the frequency of the signal on line 260, and when SDT is low, the LEDs 232 do flash at the frequency of the signal on line 260. Alternatively, when SDT is low, the LEDs 232 may not flash, while when SDT is high, the LEDs 232 may flash at the frequency of the signal on line 260. The infrared signal 215 produced by LEDs 232 is thus an amplitude modulated carrier where the carrier is modulated in on-off fashion by the signal SDT. To allow effective filtering (described below) in the parking meter 8, in one embodiment the frequency of the carrier in the signal 215 is approximately two orders of magnitude greater than the frequency of the bits in the data in the signal SDT.

The current demand of the electronics in the parking meter 8 is reduced by providing a higher power in the infrared signal 215 produced by the LEDs 232. Such higher power increases the signal-to-noise ratio in outdoor environments and makes communication with the parking meter 8 less sensitive to the precise relative position of the parking meter 8 and the hand-held transceiver 212.

To increase the power supplied in the signal 215 from the transmitter element 226 the LEDs 232 are chosen so that the voltage drop across all three LEDs 232 (connected in series) when all three LEDs 232 are radiating is relatively close to the voltage between local positive potential and local ground of the control circuit 244. The resistor 266 then may be relatively small, and more of the power in the current through the transmitter element 226 is supplied to the LEDs 232 than if the LEDs were selected so that the voltage drop across them was less. As an example, if the local positive potential is 5 volts (typical for a battery-powered hand-held transceiver 212), and if each LED 232 is a NEC SE303A, the resistor 266 need be only 3.3 ohms.

The electronic components shown schematically in FIG. 5 also assist in processing the infrared signal 217 which the parking meter 8 sends to the hand-held transceiver 212. That signal 217 is processed initially by the receiver/preamplifier 256, which produces a signal DEMOD on line 268 in response to detecting the infrared signal 217. The microcomputer 246 monitors line 268 for a signal. If a signal is present on line 268, the microcomputer 246 receives (and may process) that signal and then sends the received (and processed, if the microcomputer 246 has carried out that function) data as the signal SDM*- on lines 269 and 270 back to the control unit 218. To help in avoiding interference from the signal 215, the microcomputer 246 ignores the signal DEMOD when transmitting the signal 215.

The microcomputer 246 affords the possibility of implementing various types of signal processing operations on the signal DEMOD from the preamplifier/receiver 256. Such signal processing may be necessary because the strength of an infrared signal from the parking meter 8 may be extremely small in view of the extremely low-power communications system used in the parking meter 8, which is to be described below. As a result, under certain conditions the signal from the parking meter 8 may have severe bit distortion and signal dropout. The signal DEMOD from the receiver/preamplifier 256 thus may not, in the absence of further signal processing, accurately represent the signal SDM from the parking meter 8 transmitted in the infrared signal 217. With such further signal processing, the signal SDM* will more closely represent the signal SDM from the parking meter 8 than will the signal DEMOD.

Supplying the microcomputer 246 in the hand-held transceiver 212, and programming the microcomputer 246 to carry out signal processing operations on the signal DEMOD, permits a reduction of current consumption in the parking meter 8. The microcomputer 246 permits use of software-based signal processing algorithms which would be inconvenient or too expensive to implement in hard-wired form. For example, one way of determining the value of a bit of the SDM data in the DEMOD signal is to use the weighted sum of the value of the signal DEMOD over a somewhat large number (such as 27) of samples during the SDM bit interval. The microcomputer 246 can also be programmed to screen signals which may arise on line 268 if the relatively strong signal from the transmitter element 226 in the hand-held transceiver 212 leaks over into the receiving element 228 in the hand-held transceiver 212. Such leakage could occur through reflection from the transparent surface 214 in the parking meter 10 or from reflections from objects in the environment.

FIG. 6 is a schematic diagram of a circuit which connects the power supply of the communications section 216 of the hand-held transceiver 212 to the local positive potential and local ground of the receiver/preamplifier 256. As shown in FIG. 5, the positive potential of the communications section 216 leads across resistor 271 to the local positive potential of the receiver/preamplifier 256, and the ground of the communications section 216 leads across resistor 273 to the local ground of the receiver/preamplifier 256. Capacitor 275, connected between the local positive potential and the local ground of the receiver/preamplifier 256, smooths out any fluctuations in the difference between the local positive potential and the local ground of the receiver/preamplifier 256 which might otherwise occur as the receiver/preamplifier 256 receives and amplifies infrared communications signals such as from the parking meter 10. The capacitor 275 has a high value (such as 47 uF when the resistors 271 and 273 are each 68 ohms) to provide adequate current reserve for the transient current demands of the receiver/preamplifier 256.

FIG. 7 is a schematic diagram of the receiver/preamplifier unit 256. As shown in FIG. 7, the infrared-light-sensitive diode 234 (which may be a NEC PH302) is photoconductively biased and connected to a tank filter circuit 272. The tank filter circuit 272 is tuned, and has a Q factor appropriate, to pass the frequency of the carrier and of the data in the signal 217 which the parking meter 8 transmits to the hand-held transceiver 212. The frequency of the carrier in the signal 217 can in principle be almost any suitable frequency having an appropriate relationship to the frequency of the data in the signal SDM from the parking meter 8. The output of the tank filter 272 leads to a low-pass filter 274, in which the resistor and the capacitor are chosen to have a time constant such that the low-pass filter 274 further attenuates any signal component deriving from possible signal leakage from the infrared transmitter element 226 of the hand-held transceiver 212.

The frequency of the carrier in the signal 215 from the hand-held transceiver, and the frequency of the serial data SDT which modulates the carrier in the signal 215, should thus be chosen so that both of those frequencies are sufficiently different from the frequency of the carrier in the signal 217 from the parking meter 8. Such a sufficient difference in frequency of the carriers is of great assistance in the proper operation of the receiver/preamplifier 256 in the communications section 216 and in the proper operation of components (to be described below) in the parking meter 8. (The frequencies of the signal SDT and of the signal SDM may be the same.) As only one example, in one embodiment the frequency of the carrier in the signal 215 is such a multiple of the frequency of the carrier in the signal 217 that the low-pass filter 274 adequately attenuates signals at the frequency of the carrier in the signal 215 but adequately passes signals at the frequency of the carrier in the signal 217. Those of ordinary skill in the art are readily able to choose appropriate frequencies for the carrier in the signal 215 and for the carrier in the signal 217, and to select appropriate components and component values for the circuits disclosed herein, so that those circuits will properly process the signal 215 or the signal 217.

The output from the low-pass filter 274 leads to a four-stage amplifier. In the first two stages 276 and 278 of the amplifier the signal strength increases by approximately a factor of forty. The third stage 280 increases the signal amplitude by a further factor of about six but limits the signal amplitude to 1.2 volts by means of the feedback diodes 282 and 284 (which may each be an IN 4148). Such limiting is desirable to avoid overdriving the fourth stage 286 of the amplifier.

The fourth stage 286 of the amplifier is a voltage comparator which provides further filtering of potentially-spurious signals. The bias and filter network at the input to the fourth stage 286 causes current to be drawn only when the input signal amplitude exceeds a minimum threshold A. In one embodiment, shown in FIG. 7, that signal amplitude is approximately 90 millivolts peak-to-peak. This assures that input signals having a lesser amplitude—which are most probably noise signals—will not activate the fourth stage of the amplifier and this will not propagate into the DEMOD signal. When the output of the bias network indicates the presence of a signal in excess of the minimum threshold (90 millivolts peak-to-peak in the embodiment shown in FIG. 7), the output of the voltage comparator switches to ground, driving the output of the fourth stage 286 low. When the output of the bias network does not indicate the presence of a signal in excess of the minimum threshold, the output of the voltage comparator drives the output of the fourth stage 286 high.

The output of the fourth stage 286 feeds to an integrator 288, in which the resistor and the capacitor are selected so that the time constant of the integrator 288 is selected to be considerably less than the bit period of the data bits of the signal SDM contained in the signal 217 from the parking meter 8. (The bit period of the data bits in the signal SDM is the inverse of the bit frequency of the data bits in the signal SDM.) When the output of the fourth stage is off (that is, when there is no input signal to the fourth stage 286 above the minimum threshold A), the output of the integrator 288 on line 268—that is, the signal DEMOD —integrates toward the local positive potential. When the output of the fourth stage 286 is switched to ground, the signal output from the integrator 288—the signal DEMOD—is also switched to ground.

The Transmitting And Receiving Circuits In The Parking Meter 8

The parking meter 8 includes an infrared transmitting circuit and and infrared receiving circuit. Before describing those circuits in detail, a brief review of the disclosure of the '781 application is appropriate.

FIG. 9 of the '781 application is a schematic diagram of an electronic circuit which controls the operation of the parking meter disclosed in that application. FIG. 8 of the instant application is identical to FIG. 9 of the '781 application, except that FIG. 8 of the instant application shows further detail of the block labelled 175 in FIG. 9 of the '781 application and of signals leading to and from that block. In FIG. 8 of the instant application that block 175 is shown as including an infrared transmitter unit 298 and an infrared receiver unit 310. As also shown in FIG. 8 of the instant application, the line 290 carries the signal SDM (serial data from the parking meter 8) and the line 294 carries the signal TCLOCK (transmitter clock), from the microcomputer 164 disclosed in the '781 application to the infrared transmitter unit 298 shown in FIG. 9 of the instant application and described below in connection with that Figure. The line 292 carries the signal SDT* (serial data from the hand-held transceiver, as received by the infrared receiver unit 310) from the infrared receiver unit 310 shown in FIG. 10 of the instant application and described below in connection with that Figure to the microprocessor 164, and line 296 carries the signal D1 from the microcomputer 164 to the infrared receiver unit 310. If transmission from the hand-held transceiver 212 and reception by the parking meter 8 are accurate, the signal SDT* will contain the same data as in the signal SDT sent by the hand-held transceiver 212.

The signal TCLOCK provides the frequency of the carrier in the signal 217 which the parking meter 8 transmits to the hand-held transceiver 212. As described above, the frequency of the signal TCLOCK is chosen to be appropriately separated from the frequency of the carrier in the signal 215 so that circuits in the hand-held transceiver 212 do not confuse the carrier in the signal 215 with the carrier in the signal 217. The signal TCLOCK should be lower than the frequency of the carrier in the signal 215 to conserve current in the parking meter 8 and should be derived from signals already generated in the parking meter 8.

The Infrared Transmission System In The Parking Meter 8

FIG. 9 of the instant application shows the infrared transmitter unit 298 of the parking meter 8. Line 294 leads the signal TCLOCK to the base of transistor 300. Line 290 in turn carries the signal SDM from the microcomputer 164 to the emitter of transistor 300.

To conserve current the circuit shown in FIG. 9 draws no current except when the microcomputer 164 is transmitting data in the form of the SDM signal on line 290. When the microcomputer 164 is not sending data on line 290, it holds the signal SDM high. When SDM is high: (1) transistor 300 does not conduct; (2) the potential at node 302 is high; (3) transistor 304 does not conduct; (4) transistor 306 does not conduct; and (5) no current flows through the infrared LED 308. The bias circuits for the transistors 300. 302, and 304 also draw no current when SDM is high.

The transmitter circuit 298 thus draws current only when it is sending data. This occurs only when SDM is low; accordingly, the microcomputer 164 pulses SDM low to activate the transmitter 298 to send an infrared signal. When SDM is low, the signal TCLOCK alternately turns transistor 300 on and off at the frequency of the signal TCLOCK, thus alternately drawing current through transistor 300 and blocking current from flowing through the transistor 300. When no current flows through the transistor 300, no current flows in the transmitter unit 298, as described above. When current does flow through the transistor 300: (1) the potential at node 302 drops below positive potential; (2) transistor 304 conducts; (3) transistor 306 conducts; (4) current flows through the infrared LED 308, sending infrared light from the parking meter 8 as part of the signal 217. The current level to the LED 308 is regulated by the emitter resistor 307 and by the positive supply voltage as supplied through transistor 304.

Thus, during the time while the microcomputer 164 pulses SDM low, the infrared LED 308 emits pulses of infrared light at the frequency TCLOCK. Those pulses are the pulses which the receiver element 228 in the hand-held transceiver 212 receives, amplifies, and passes on to the control section 218 of the hand-held transceiver as the complement SDM- of the signal SDM.

The Infrared Receiving System In The Parking Meter 8

FIG. 10 is a schematic diagram of the infrared receiver unit 310 in the parking meter 8. This unit resolves two major problems presented by the requirement of consuming as little current as possible.

First, the photodiode 311 used in the receiver on the parking meter 8 cannot be continuously biased because leaving the photodiode 311 continuously biased would lead to a continuous current drain. The photodiode 311 in the receiver in the parking meter 8 must be able at any time to receive the signals 215 from the hand-held transceiver 212.

Second, because the infrared receiver in the parking meter 8 must be continuously able to receive and respond to signals detected by the photodiode 311 in the parking meter 8, the bias current drawn by the electronic components to which the output of the photodiode 311 leads must be extremely small.

The invention resolves these problems.

As shown in FIG. 10, a photodiode 311 is connected across a parallel L-C filter 312 formed by a capacitor 314 and an inductor 316. The inductor 316 shorts the photodiode 311 in a DC sense. Such shorting assures that signals which the photodiode 311 produces in response to sunlight (which will be continuous or modulated at low frequency by reflections, clouds, or apparent changes in the sun's position), to infrared light from lamps (which will typically be modulated at a relatively low frequency such as 50 or 60 cycles per second and certain low harmonics of that frequency), or to infrared light from other environmental sources, will short through the inductor 316 and therefore will not activate the electronic components to which the photodiode 311 is also connected. No bias is applied to the photodiode 311, which thus operates in the photovoltaic mode producing a potential across its anode and cathode in response to incident infrared light. Due to the photovoltaic, that is, non-biased, mode of operation, the photodiode may be connected with either its anode or its cathode connected to local ground.

The L-C filter 312 is designed to have a resonant frequency at the frequency of the carrier in the signal 215 sent by the transmitter element 226 in the hand-held transceiver 212. This assures both that the L-C filter 312 will respond preferentially to signals at that frequency and that the L-C filter 312 will have a high impedance to signals at that frequency, thus presenting a high-amplitude signal to the electronic components to which the L-C filter 312 is connected when the photodiode 311 produces a signal at that frequency as it receives the signal 215 from the hand-held transceiver 212. The Q factor of the L-C filter 312 is chosen so that the damping time of the filter is short compared to the minimum data bit period in the signal SDT (for example, an order of magnitude less than that minimum data bit period) but long compared to the period of the carrier in the signal 215. (The period of a signal is the inverse of the frequency of a signal.) As described above, those of ordinary skill in the art are able to select appropriate values for the components of the L-C filter 312.

The photodiode 311 and the L-C filter 312 lead to an amplifier 318. The amplifier 318 stacks two self-biased Class A amplifier stages 319 and 321 between the local positive potential and local ground. (As described in the '781 application, the electronic components in the parking meter 8 normally are powered at approximately 3.5 volts.) The first stage 319 has an NPN transistor 320; the second stage has a complementary PNP transistor 322. The two amplifier stages, and the two transistors 320 and 322, share a single DC bias current. The signal output of the first stage 319, which is at the collector of transistor 320, is coupled through capacitor 324 (which blocks DC signals and attenuates low-frequency signals) to the signal input to the second stage 321, which is at the base of the transistor 322. Those skilled in the art are able to choose a value for the capacitor 324 which is appropriate for the frequency of the carrier in the signal 215. In one embodiment, the capacitor 324 is 330 pF. The signal to the first stage 319 leads from the L-C filter 312 over capacitor 317 to the base of transistor 320. The capacitor 317 has a value chosen to pass signals at the frequency of the carrier in the signal 215, to block DC signals, and to attenuate very low frequency signals. Those of ordinary skill in the art are able to select a value for capacitor 317 to accomplish those goals. Capacitor 317 may have a value comparable to capacitor 324; in one embodiment, capacitor 317 has a value of 330 pF.

For AC purposes the ground reference for the first stage 319 and the second stage 321 is at the node 326, which is decoupled to local DC ground by the capacitor 328. Capacitor 328 should be a low-leakage capacitor such as a tantalum capacitor to reduce leakage currents to local ground (hence reducing overall current consumption of the amplifier). The capacitor 328 passes to the local ground signals at the frequency of the carrier signal in the signal 215, of the data signal SDT which modulates the carrier in the signal 215, and preferably also signals of frequency considerably below the frequency of the data signal SDT. The capacitor 328 prevents signals at such frequencies from affecting the bias of the first stage 319 and the second stage 321 and thus permits each stage 319 and 321 to remain properly self-based in Class A mode and to share a common DC bias current, which the capacitor 328 decouples from local ground. Those of ordinary skill in the art are able to select a value for capacitor 328 appropriate to accomplish those goals. In one embodiment the capacitor 328 is 4.7 uF—approximately four orders of magnitude greater than the capacitance of capacitor 317 or 324. Each of the transistors 320 and 322 is self-biased via a pair of resistors 330 (which in one embodiment are each 1 Megohm) from collector to base; AC feedback is removed from the base of each transistor 320 and 322 to local ground through the capacitors 332 (which are 0.1 uF in one embodiment). The DC bias current of the two stages is set as low as possible but high enough that the two stages will operate in Class A mode for expected input signal strengths. Component values are chosen so that substantially all voltage drop across each transistor is the base-to-emitter voltage drop of the transistor.

With these bias conditions, the bias current set point for the amplifier 318 is then determined by the base-to-emitter voltage drops of the two transistors 320 and 322 and by the values of the resistors 334 and 336 in the path leading from the local positive potential to the collector of transistor 320, by the values of the resistors 338 and 340 in the path leading from the emitter of transistor 320 to the emitter of transistor 322, and by the value of the resistor 342 in the path leading from the collector of transistor 322 to local ground. Because the base-to-emitter voltage drops of the transistors 320 and 322 vary with temperature, the DC bias current will likewise vary with temperature. In one illustrated embodiment, in which transistor 320 is a 2N5089, transistor 322 is a 2N5086, resistor 334 is 4.99 kOhm, resistor 336 is 105 kOhm, resistor 338 is 17.4 kOhm, resistor 340 is 5.62 kOhm, and resistor 342 is 22.5 kOhm, the bias current varies from approximately 13.7 microamperes at −40 degrees C. to approximately 16.8 microamperes at +60 degrees C. Such a low bias current is acceptable in battery-powered applications such as the parking meter 8. Because the resistors 334, 336, 338, 340, and 342 set the DC bias current and thus the DC voltage at the base of transistor 350, the foregoing resistor values are plus or minus one per cent. The illustrative capacitance values given herein may be industry standard tolerances.

The amplifier 318 has additional features which improve its reliability in amplifying only signals presented to its input by the photodiode 311 and the L-C filter 312 connected across the photodiode 311. The capacitor 344 (which in one embodiment is 10 uF) leads to local ground from between the resistors 334 and 336 to decouple to ground and away from the bias current input to the first stage 319 of the amplifier 318 any transients on the local positive potential. Capacitor 344 should be a low-leakage capacitor such as a tantalum capacitor to reduce leakage currents to local ground. The capacitor 346 (which in one embodiment is 0.01 uF) connected in parallel with the resistor 338 at the emitter of transistor 320 is an emitter degeneration capacitor to boost the overall gain of the amplifier 318. The value of the capacitor 346 should be determined experimentally to produce the highest overall gain for the amplifier 318 for signals at the carrier frequency in the signal 215 from the transmitter element 226 in the hand-held transceiver 212.

The output of the amplifier 318 leads over line 348 to the base of transistor 350. The base of transistor 350 is biased for DC purposes by the DC bias current of the amplifier 318 flowing through resistor 342. The value of resistor 342 is chosen so that, at that DC bias current, the potential at the base of the transistor 350 is less than the voltage required to cause the transistor 350 to conduct.

In those conditions—that is, when only the DC bias current flows through the transistors 320 and 322, and no AC signals are present—the transistor 350 does not conduct, and the potential at node 352 is at the local positive potential.

When an AC signal of sufficient magnitude flows through the amplifier 318, and thus through the resistor 342, the transistor 350 conducts for that portion of the AC signal cycle during which the potential at the base of transistor 350 exceeds the "on" voltage of the transistor 350. For that portion of the AC signal cycle the potential at the node 352 is driven to ground.

Node 352 is connected to an integrating filter 353 which comprises a resistor 354 and a capacitor 365. For the portion of the AC signal cycle during which the potential at the base of the transistor 350 again is below the "on" potential of the transistor 350, the transistor 350 again ceases to conduct, and the potential at the node 352 integrates toward the local positive potential with a time constant determined by the values of the resistor 354 and the capacitor 356. The time constant of this integrating section is the product of the resistance of resistor 354 and the capacitance of capacitor 356; those components are selected so that that time constant is much longer than the carrier period defined by the inverse of the frequency of the carrier in the signal 215 from the transmitter element 226 in the hand-held receiver 212.

With a time constant much longer than the carrier period, the potential at node 352 rises only to a very small extent toward the local positive potential before the transistor 350 again conducts during the next cycle of the AC signal. Thus, when the carrier bit stream from the transmitter element 226 is present in the current through the transistors 320 and 322, the potential at the node 352 is driven to ground and remains substantially at ground. The filter 353 thus substantially screens from the node 352 any signal from the stream of carrier pulses from the transmitter element 352.

The time constant of the integrating filter 353 is also chosen to be much shorter than the period of the data SDT in the signal 215 defined by the inverse of the frequency of the data bits in the data signal SDT in the signal 215 from the transmitter element 226. Such selection of the time constant guards against any significant distortion in the rise time at the node 352 of the leading edge of a data bit.

One way to select the time constant of the integrating filter 353 (as employed in one embodiment of the invention) is to place that time constant approximately one order of magnitude greater than the carrier period of the carrier in the signal 215 and approximately one order of magnitude less than the data period of the data SDT in the signal 215.

The "on" voltage of the transistor 350 varies with temperature. The transistor 350 must be nonconducting, in the absence of an AC signal, over the entire temperature range to which the parking meter 8 will be exposed. Thus, the value of the resistor 342 must be selected so that, at the DC bias current flowing through the transistors 320 and 322, the potential at line 348 makes transistor 350 nonconducting over the entire temperature range in the absence of an AC signal. The value of the resistor 342 should also be chosen so that only an appreciable signal through the transistor 322 (that is, an appreciable output of the second stage 321) will drive the potential across the resistor 342 above the "on" voltage of the transistor 350. These considerations led to the value of resistor 342 already mentioned for the illustrated embodiment; other values for the resistor 342 will be appropriate for other embodiments.

The signal at node 352 is coupled to the microprocessor 164 through a carrier detect delay circuit 358 which delays any change in potential at node 352 from reaching microprocessor 164 for an appropriate predetermined time after pulses of the carrier stream in the signal 215 from the transmitter element 226 drive the potential at node 352 low. Such a time delay rejects false data from sources of unwanted infrared signals such as TV channel changers.

The signal D1 leads over line 296 from the microprocessor 164 shown in FIG. 8 to the carrier detect delay section 358 shown in FIG. 10. When the microprocessor 164 is not receiving an SDT* signal on the line 292, the microprocessor 164 holds the signal D1 on line 296 low.

When the amplifier 318 is not detecting any signal, the potential at node 352 is high, and thus the level on line 360 is also high.

In those conditions the output of the NOR gate 362 is low, and the level at node 364 is also low. The output of NOR gate 366 to line 368 is thus high. The output of NOR gate 372 to line 292—the signal SDT*—is thus high and remains high. Because line 292 terminates in a high impedance in the microprocessor 164, little current flows through line 292 when the receiver in the parking meter 8 is in this dormant state.

When the potential at node 352 goes low, line 360 carries that low potential to the NOR gate 362. The output of the NOR gate 362, previously low, then goes high. The potential at node 364 then integrates toward the high level with a time constant determined by the values of the capacitor 374 and the resistor 376. When the potential at node 364 reaches the positive triggering potential of the NOR gate 366, the output of the NOR gate 366 goes low. The microprocessor 164 continues to hold the signal D1 on line 296 low during this time.

If the AC signal which drove the potential at the node 352 low is still doing so when the level on line 368 goes low, the AC signal has a duration which exceeds the rise time of the R-C integrating network formed by the capacitor 374 and the resistor 376. In such a case, with both of its inputs low, the NOR gate 370 drives its output high, and the NOR gate 372 drives its output low. The low level on line 292 leads to and is detected by the microprocessor 164. The microprocessor 164 then asserts the signal D1 on line 296 high, which has the results described below.

If, however, the AC signal which drove the potential at node 352 low is no longer present at the time the level on line 368 goes low, the level on line 360 will have returned high (that is, will have returned above the high triggering potential of the NOR gate 370) before the level on line 368 goes low. In such a case, the NOR gate 370 continues to assert a low output uninterruptedly, and the NOR gate 372 continues to assert a high output uninterruptedly. The level on line 292 thus remains uniformly high, and the microprocessor 164 perceives no change in the condition of the receiver. This shields the microprocessor from receiving spurious signals over the line 292.

When the microprocessor 164 asserts the signal D1 high after receiving a pulse stream on the line 292, the output of NOR gate 366 to line 368 immediately goes low. With the level on line 368 low, the NOR gate 370 passes changes in the level on line 360 (in inverted form) to its output, and the NOR gate 372 inverts the output of NOR gate 370 and thus passes to line 292 as the signal SDT* the changes in level on line 360. The microprocessor 164 receives and processes the signal SDT*. When the microprocessor 164 detects (through appropriate software) that the signal SDT* has remained high for a suitable period of time, indicating that carrier pulses from the transmitter element 226 are no longer reaching the receiver unit 310 of the parking meter 8, the microprocessor 164 asserts the signal D1 low, thus restoring the operation of the carrier detect delay circuit 358 to the initial condition described above.

The resistor 378 and the diode 380 are provided in parallel with the resistor 376 to form a trip circuit as further protection against transmission of spurious signals through the carrier detect delay circuit 358. If, after a spurious signal has driven the level on line 360 low, the spurious signal drives the level on line 360 high again (as, for example, in the case of spurious data signals), the output of NOR gate 362 goes low. If spurious data is being received, this will ordinarily occur before the potential at the node 364 has integrated to the positive triggering potential of the NOR gate 366. The resistor 378 is chosen with a much smaller resistance than the resistor 376 so that the potential at node 364 will discharge to ground through the resistor 378 and the diode 380 with a much smaller time constant than the time constant with which the potential at node 364 will integrate toward the positive potential. (Thus, the resistor 378 typically will have a resistance less than that of the resistor 376.) With such a choice of time constants, the potential at node 364 quickly returns to ground, from whatever level it has integrated to, when a spurious data signal changes the level on line 360.

Of course, to avoid the possibility that true data signals from the transmitter element 226 will fail to propagate through the carrier detect delay circuit 358, the control section 218 must be programmed not to assert true data pulses from the transmitter element 226 until the control section 218 has received from the parking meter 8 confirmation that the parking meter 8 has asserted D1 high, or alternatively not to assert true data pulses from the transmitter element 226 until the transmitter element 226 has asserted carrier pulses for an adequate interval of time and thus not until the microprocessor 164 has asserted D1 high.

Those of ordinary skill in the art are able to select values of the capacitor 374, the resistor 376, and the resistor 378, and to program the hand-held transceiver 212 in an appropriate fashion, to achieve a desired degree of rejection of false data signals while still permitting the parking meter 8 to receive the data signal SDT in the signal 215.

The function performed by the carrier detect delay circuit 358 may also be implemented in software by a program within the microprocessor 164. Software to perform the protective function of the carrier detect delay circuit 358 may readily be written by one of ordinary skill in the art.

Devices such as the parking meter 8 will, when equipped with an infrared communications system, be exposed to attempts at interference (such as, for example, attempts to obtain free parking time or to cause the parking meter 8 to record or to display incorrect information) and perhaps even at vandalism or theft. Therefore, the best mode of operating devices such as the parking meter 8 is not to disclose the frequency of the carrier in the signal 215, the frequency of the carrier in the signal 217, the frequency of the data in the signal SDT, the frequency of the data in the signal SDM, the time constant of the capacitor 374 and the resistor 376, or the time constant of the capacitor 374 and the resistor 378. The frequencies can be selected, in principle, almost anywhere within a very broad range defined by (a) a lower frequency limit for the carrier in the signal 215 and for the carrier in the signal 217 greater than the modulated frequencies of infrared signals of sufficient amplitude to cause interference, which may be commonly present in the environment(s) in which the parking meter 8 (or other device) is to be installed and by (b) an upper limit set by the power consumption of components within the parking meter 8 and/or by the high-frequency capacitance of the circuitry and of the active components (such as the transistors) used in the circuitry. The carrier in the signal 215 should be a sufficient multiple (for example, four) of the carrier in the signal 217 to facilitate distinguishing the two carriers. The time constants can be selected, in principle, within a very broad range defined by (a) a lower limit determined by the characteristics of commonly available sources of infrared signals and by the characteristics of the signals they emit and by (b) an upper limit set by considerations of auditing efficiency. Those of ordinary skill in the art are readily able not only to select appropriate frequencies and time constants but also to recognize the importance of not freely disclosing the frequencies and time constants actually selected.

FIG. 11 is a diagram of a more general form 382 of the shared-bias AC amplifier 318 shown schematically in FIG. 10. As shown in FIG. 11, a generalized amplifier 382 receives an input on a line 384 in a top amplifier stage 386. The top amplifier stage 386 is connected to a first reference potential 388 by line 390. The top amplifier stage draws a DC bias current through line 390; the DC bias current flows from the first stage 386 over line 392 to a second, bottom amplifier stage 394. Sharing a bias among the two stages reduces by a factor of two the net bias current drain of the amplifier. This is a substantial advantage in low power applications, such as battery-powered or solar-powered equipment.

The bottom amplifier stage 394 uses the DC current from line 392 as its own DC bias current, which flows out of the bottom stage 394 through line 396 to a second reference potential 398 which has a lower potential than the first reference potential 388.

Both the top stage 386 and the bottom stage 394 contain active circuit components (not shown). Those components are biased within each stage 386 and 394 so that those components will operate as Class A amplifiers. By the phrase "operate as Class A amplifiers" it is meant that the active components are on. In other words, the active components do not need to switch from an inactive state to an active state to be able to amplify an input signal to produce an amplified output signal; and the active components remain on while amplifying the input signal, that is, they do not (except under overdrive conditions) switch on and off while amplifying the input signal.

In addition, it is contemplated that the active components within each amplifier stage are operating in a range of substantially linear amplification. In the specific example (shown in FIG. 10) in which the active components are transistors, it is intended that each transistor operate in a relatively linear region; that is, that each transistor not operate in the saturation or cutoff regions. Although it is possible that such an active component could (in the course of ordinary operation) be driven into a region of non-linear operation, it is expected that the active component will recover from such a condition and return to the linear region of operation when the applied signal which caused the non-linear operation is removed.

The signal input line 384 to the top amplifier stage 386 leads through an impedance 400 (which may be a capacitor) which has a low impedance at or above the signal frequency but presents a high impedance below the signal frequency. The impedance 400 blocks DC signals from entering the top stage 386 and presents a high impedance at unwanted frequencies below the signal frequency. The top stage 386 amplifies the signals which pass the impedance 400; the output of the top stage 386 leads over line 402 through impedance 404 (which also blocks DC signals and thus may be a capacitor) to become the input to the bottom stage 394. The bottom stage 394 in turn amplifies the signals at its input and places the amplified signal on its output line 406, which leads to other components which may vary with particular applications.

The line 392 which carries the DC bias current from the top amplifier stage 386 to the bottom amplifier stage 394 also leads through impedance 408 (which also blocks DC signals and thus may be a capacitor) to the second reference potential 398. For all frequencies of interest above DC impedance 408 decouples the output of the top amplifier stage 386 and the input of the bottom amplifier stage 304 to the second reference potential. Impedance 408 presents a low impedance to AC signals. With such an impedance value the impedance 408 decouples (with respect to AC signals) the top and bottom stage so that the active components within the top stage 386 and the bottom stage 394 are isolated with respect to AC signals to suppress undesirable and unwanted oscillation. As a result, for DC purposes (and, in particular, for purposes of DC bias current) the top stage 386 and the bottom stage 394 are stacked in a totem-pole configuration between the first reference potential 388 and the second reference potential 398 and thus share the same DC bias current. (Low-frequency AC differences between the first reference potential 388 and the second reference potential 398 are screened by appropriate circuitry (not shown). Low-frequency signals are also screened from the input to the top stage 386 by impedance 400 and (if any such signals should appear on the line 402) from the input to the bottom stage 394 by the impedance 404. Typically the impedances 400 and 404 have substantially the same value.)

If the impedance 408 presented too great an impedance for signals at AC, undesirable and unwanted oscillations could occur between the active components of the top stage 386 and the active components of the bottom stage 394. As shown in the example of FIG. 10, if the impedances 400, 404, and 408 are capacitors, the capacitor 408 may be chosen with a capacitance approximately four orders of magnitude larger than the capacitance of capacitors 400 and 404.

Figure 14:
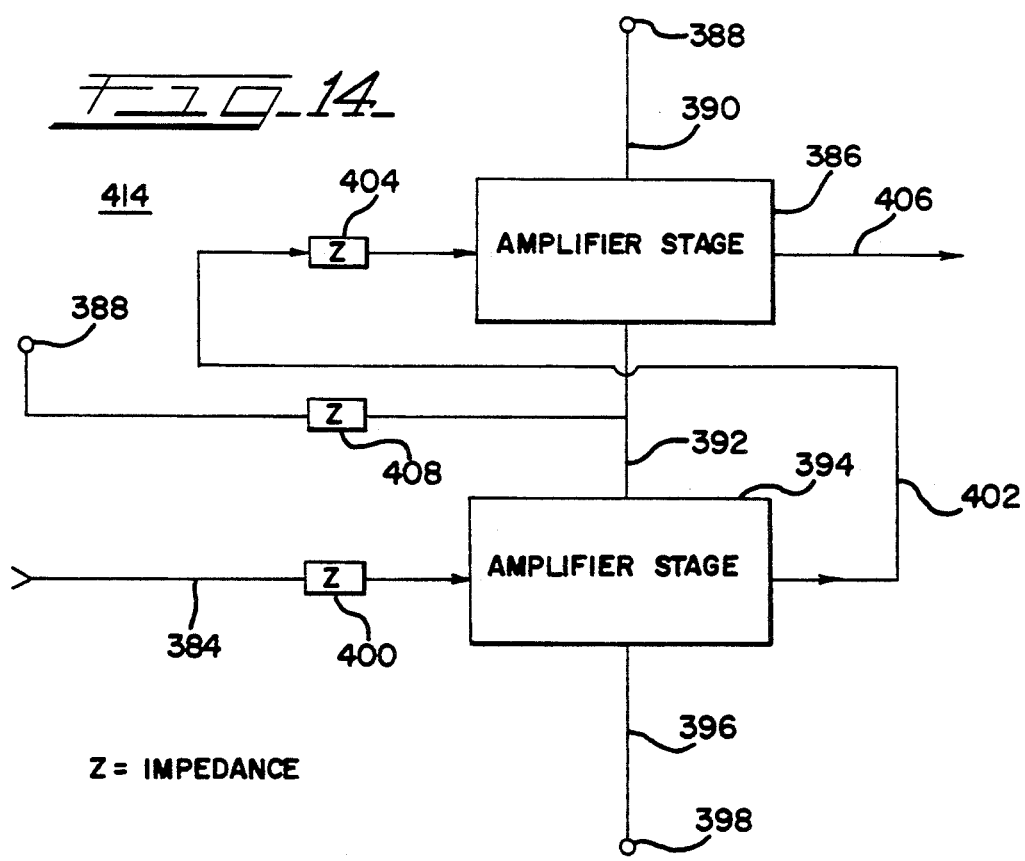
FIG. 14 is a schematic diagram of another more generalized version of the amplifier schematically shown in FIG. 10.

The principle of the invention also extends to: (1) connecting the impedance 408 to the first reference potential (as in an alternative general form 410 shown schematically in FIG. 12); (2) leading the input signal on line 400 to the bottom stage 394 and using the top stage 386 to produce the amplified output signal (as in an alternative general form 412 shown schematically in FIG. 13); and (3) both (a) connecting the impedance 408 to the first reference potential and (b) leading the input signal on line 400 to the bottom stage 394 and using the top stage 386 to produce the amplified input signal (as in an alternate general form 414 shown schematically in FIG. 14).

Moreover, the amplifier of the invention may be used with an input signal from any type of sensor—not just from a photodiode used to receive infrared communications from a hand-held transceiver. For example, the amplifier may be used (with suitable input and output filters, where needed) to amplify signals produced by a token interacting with a sensor such as the piezoelectric detector disclosed in U.S. Pat. No. 4,848,556 to Shah, Pester, and Stern, issued Jul. 18, 1989, or from a ferrous metal detector such as a Hall-effect magnetic sensor or a frequency-shift detector, or to amplify signals from an ultrasonic detector.

Finally, because the impedance 408 shown in each of FIGS. 11 through 14 decouples the amplifier stages from their shared bias current for AC purposes, two or more stages—that is, N stages, where N is an integer greater than or equal to two—may be stacked in totem-pole fashion between first reference potential 388 and the second reference potential 398, so long as the bias current connection between each amplifier stage and the adjacent amplifier stage is decoupled to one of the two reference potentials for the signals at the frequencies which the stacked stages are to amplify. Moreover, in such a stack of N stages, it makes little difference, so long as the impedances 408 are sufficiently small (if the impedances 408 are capacitors, so long as they have a sufficiently large capacitance), which stage receives the input signal, which stage produces the output signal, or in what order the stacked stages exchange signals to be amplified intermediate a first stage which receives the input signal and a second stage which produces the output signal. Thus, the input signal may lead to any arbitrary first stage of the N stages, the output signal may lead from any arbitrary second stage of the N states, and the remaining N-2 stages (if N is greater than two) may receive input connections from the output of any other stage and send their output to the input of any other stage (except that the first (or input) stage receives no input other than the input signal, and the second (or output) stage has no output other than the output signal). Of course, it will be conservative practice to include an impedance 404 (which blocks DC signals and thus may be a capacitor) as shown in FIGS. 11–14 in each line which carries an output from one stacked stage to an input of another stacked stage. Such an impedance assures that DC signals and low-frequency signals do not propagate to the input of another amplifier stage.

FIG. 15 is a schematic diagram of one such N-stage amplifier 416 for the particular case where N equals five. The impedances 408 shown in FIG. 15 have the same characteristics described above in connection with FIGS. 11 through 14. Although the impedances 404 and 408 shown in FIG. 15 have the same reference numbers, it will be appreciated that those impedances 404 and 408 need not have the same value. Moreover, the amplifier stages 410 intermediate the top stage 386 and the bottom stage 394 need not have identical characteristics, and need not have different characteristics from the top stage 386 or the bottom stage 394. The top stage 386 and the bottom stage 394 also need not have different characteristics. Moreover, the transfer connections 402 may be connected from the signal output of one stage to the signal input of another stage in any arbitrary order, with the limitation described above as to the stage which receives the input signal and the stage which produces the output signal.

CONCLUSION

The communications circuits described herein permit low-power communications not only in environments where a device (such as the parking meter 8) may be installed but also in a factory or other location, where the communications may serve to program electronics in the device (such as the microprocessor 164 or associated memory) and/or to perform diagnostic tests on the device (such as the parking meter 8) to make sure that it is operating properly.

Those skilled in the art will appreciate that the embodiments described herein may be modified without departing from the invention and that, in particular, the improvements described herein can be used in many token-actuated devices other than parking meters. Indeed, the low-power infrared transmitting and receiving system can be used in any device in which an ultra-low-power infrared transmitting and receiving system would be an advantage. Moreover, the ultra-low-power transmitting and receiving system can be used to exchange signals with a traditional transmitting and receiving system, if the traditional transmitting and receiving system can provide adequate power in the signal 215 and can adequately process the signal 217.

Moreover, the improved amplifier of the invention may be used in any application in which an amplifier must amplify an incident signal and in which the amplifier must draw very low current.

Thus, although particular embodiments are described above, those embodiments are only examples of the invention. Numerous changes in the embodiments described above may be made without departing from the spirit and scope of the invention, which is defined by the following claims.

We claim:

1. A receiver which is part of a transmitter/receiver pair for extracting a digital data signal from an amplitude carrier signal produced by the transmitter, wherein the amplitude modulated carrier signal is a pulse stream modulated in on-off fashion by the digital data signal, comprising:
    an amplifier for amplifying the amplitude modulated carrier signal;
    means for filtering the output of the amplifier to remove the carrier signal and output one of two voltage levels to represent the extracted data signal;
    wherein the amplifier comprises a plurality of amplifier stages with each stage having a signal input terminal, a signal output terminal, a bias current input terminal, and a bias current output terminal;
    wherein the bias current input and output terminals of the amplifier stages are connected together in series so that each of the stages shares the same bias current.

2. The receiver as set forth in claim 1 wherein the signal input and output terminals of each successive amplifier stage are capacitively coupled.

3. The receiver as set forth in claim 3 wherein the input signal to each amplifier stage is the voltage difference between the bias current output terminal and the signal input terminal, and wherein the output signal from each amplifier stage is the voltage difference between the bias current output terminal and the signal output terminal, and further wherein the bias current output terminal of each amplifier stage is capacitively coupled to a constant potential to thereby provide an AC ground.

4. The receiver as set forth in claim 3 wherein each amplifier is self-biased with bias current supplied to each signal input terminal through a resistor, the resistor being capacitively coupled to ground to remove AC feedback.

5. The receiver as set forth in claim 4 further comprising a bandpass filter for selectively passing the amplitude modulated carrier signal to the amplifier.

6. The receiver as set forth in claim 4 wherein the amplifier output filtering means comprises:
    a transistor quiescently maintained at cut-off and turned on when the amplifier receives a voltage pulse;
    a resistor connected between a voltage source and the transistor collector; and,
    a capacitor connected between the transistor collector and ground so that the collector output of the transistor is high when the transistor is cut off and remains low when a high frequency pulse stream is applied to the transistor base.

7. The receiver as set forth in claim 1 additionally comprising means for delaying the output of an extracted data bit from the receiver until consecutive carrier signal pulses have been received by the receiver for a predetermined length of time and wherein the delaying means may be disabled upon receipt of a signal from an external processing means.

8. The receiver as set forth in claim 1 additionally comprising a photodiode for receiving an amplitude modulated signal in the form of electromagnetic radiation.

9. A receiver which is part of a transmitter/receiving pair for extracting a digital data signal from a modulated carrier signal produced by the transmitter, comprising:
    an amplifier for amplifying the modulated carrier signal;
    means for demodulating the modulated carrier signal;
    wherein the amplifier comprises a plurality of amplifier stages with each stage having a signal input terminal, a signal output terminal, a bias current input terminal, and a bias current output terminal;
    wherein the bias current input and output terminals of the amplifier stages are connected together in series so that each of the stages shares the same bias current.

10. The receiver as set forth in claim 9 wherein the signal input and output terminals of each successive amplifier stage are capacitively coupled.

11. The receiver as set forth in claim 10 wherein the input signal to each amplifier stage is the voltage difference between the bias current output terminal and the signal input terminal, and wherein the output signal from each amplifier stage is the voltage difference between the bias current output terminal and the signal output terminal, and further wherein the bias current output terminal of each amplifier stage is capacitively coupled to a constant potential to thereby provide an AC ground.

12. The receiver as set forth in claim 11 wherein each amplifier stage is self-biased with bias current supplied to each signal input terminal through a resistor, the resistor being capacitively coupled to ground to remove AC feedback.

13. The receiver as set forth in claim 12 further comprising a bandpass filter for selectively passing the modulated carrier signal to the amplifier.

14. The receiver as set forth in claim 9 additionally comprising means for delaying the output of an extracted data bit from the receiving until consecutive carrier signal pulses have been received by the receiver for a predetermined length of time and wherein the delaying means may be disabled upon receipt of a signal from an external processing means.

15. The receiver as set forth in claim 9 additionally comprising a photodiode for receiving a modulated carrier signal in the form of electromagnetic radiation.

* * * * *